(12) United States Patent
Kaneko et al.

(10) Patent No.: US 8,599,356 B2
(45) Date of Patent: Dec. 3, 2013

(54) SHUTTER MEMBER, A LITHOGRAPHIC APPARATUS AND DEVICE MANUFACTURING METHOD

(75) Inventors: Takeshi Kaneko, 's Hertogenbosch (NL); Erik Henricus Egidius Catharina Eummelen, Eindhoven (NL); Nina Vladimirovna Dziomkina, Eindhoven (NL); Matthias Kruizinga, Herten (NL)

(73) Assignee: ASML Netherlands B.V., Veldhoven (NL)

( * ) Notice: Subject to any disclaimer, the term of this patent is extended or adjusted under 35 U.S.C. 154(b) by 437 days.

(21) Appl. No.: 12/879,852

(22) Filed: Sep. 10, 2010

(65) Prior Publication Data

US 2011/0096305 A1 Apr. 28, 2011

Related U.S. Application Data

(60) Provisional application No. 61/241,724, filed on Sep. 11, 2009.

(51) Int. Cl.
*G03B 27/52* (2006.01)
*G03B 27/32* (2006.01)

(52) U.S. Cl.
USPC .............................. 355/30; 355/77

(58) Field of Classification Search
None
See application file for complete search history.

(56) References Cited

U.S. PATENT DOCUMENTS

| 4,509,852 A | 4/1985 | Tabarelli et al. |
| 7,450,217 B2 | 11/2008 | Boogaard et al. |
| 7,528,929 B2 * | 5/2009 | Streefkerk et al. ............ 355/30 |
| 2004/0136494 A1 | 7/2004 | Lof et al. |
| 2004/0207824 A1 | 10/2004 | Lof et al. |
| 2006/0038968 A1 | 2/2006 | Kemper et al. |
| 2006/0119809 A1 | 6/2006 | Verhagen et al. |
| 2006/0158627 A1 | 7/2006 | Kemper et al. |
| 2007/0216881 A1 * | 9/2007 | Van Der Schoot et al. ..... 355/53 |

(Continued)

FOREIGN PATENT DOCUMENTS

| EP | 1420300 | 5/2004 |
| JP | 2005-303316 | 10/2005 |

(Continued)

OTHER PUBLICATIONS

Chinese Office Action dated Oct. 29, 2012 in corresponding Chinese Patent Application No. 201010282782.4.

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

An immersion lithographic apparatus that includes a substrate table, a fluid handling structure and a swap table. The substrate table is configured to support a substrate. The fluid handling structure is configured to supply and confine immersion liquid to a space defined between a projection system and the substrate table, the substrate, or both. The swap table has a shutter surface configured to be under the fluid handling structure during, for example, swap of the substrate on the substrate table. In use, a transfer surface between a surface of the substrate table and a surface of the swap table is moved under the fluid handling structure to help stop escaping immersion liquid. A shutter member and a method are also disclosed.

20 Claims, 13 Drawing Sheets

(56) References Cited

U.S. PATENT DOCUMENTS

| | | |
|---|---|---|
| 2008/0094592 A1* | 4/2008 | Shibazaki ............... 355/53 |
| 2008/0111979 A1* | 5/2008 | Emoto ..................... 355/30 |
| 2008/0212046 A1 | 9/2008 | Riepen et al. |
| 2009/0206304 A1 | 8/2009 | Dziomkina |
| 2009/0279060 A1 | 11/2009 | Direcks et al. |
| 2009/0279062 A1 | 11/2009 | Direcks et al. |
| 2009/0296065 A1 | 12/2009 | Cloin et al. |
| 2010/0060868 A1 | 3/2010 | Tanasa et al. |
| 2010/0060870 A1 | 3/2010 | Dziomkina et al. |
| 2010/0097586 A1 | 4/2010 | Kuit et al. |

FOREIGN PATENT DOCUMENTS

| | | |
|---|---|---|
| JP | 2007-281308 | 10/2007 |
| JP | 2008-124194 | 5/2008 |
| JP | 2008-124219 | 5/2008 |
| JP | 2008-130745 | 6/2008 |
| JP | 2008-147635 | 6/2008 |
| JP | 2009-117842 | 5/2009 |
| JP | 2009-164304 | 7/2009 |
| JP | 2010-109365 | 5/2010 |
| TW | 200839456 | 10/2008 |
| WO | 99/49504 | 9/1999 |
| WO | 2005064405 | 7/2005 |
| WO | 2008/059916 | 5/2008 |
| WO | 2009/060585 | 5/2009 |
| WO | 2009/084203 | 7/2009 |

OTHER PUBLICATIONS

Japanese Office Action mailed Apr. 24, 2012 in corresponding Japanese Patent Application No. 2010-199597.

* cited by examiner

SHUTTER MEMBER, A LITHOGRAPHIC APPARATUS AND DEVICE MANUFACTURING METHOD

This application claims priority and benefit under 35 U.S.C. §119(e) to U.S. Provisional Patent Application No. 61/241,724, entitled "A Shutter Member, A Lithographic Apparatus and Device Manufacturing Method", filed on Sep. 11, 2009. The content of that application is incorporated herein in its entirety by reference.

FIELD

The present invention relates to a shutter member, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of, for example, an integrated circuit (IC), a device or an IC device. In that instance, a patterning device, which is alternatively referred to as a mask or a reticle, may be used to generate a circuit pattern to be formed on an individual layer of the IC, device or IC device. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

Another arrangement is an all wet arrangement in which the immersion liquid is unconfined as disclosed in PCT patent application publication WO 2005/064405. In such a system, the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the swap of the tables may take place, for example, under the projection system.

In an immersion apparatus, immersion liquid is handled by a fluid handling system or apparatus. A fluid handling system may supply immersion fluid and therefore be a fluid supply system. A fluid handling system may at least partly confine fluid and thereby be a fluid confinement system. A fluid handling system may provide a barrier to fluid and thereby be a barrier member. Such a barrier member may be a fluid confinement structure. A fluid handling system may create or use a flow of fluid (such as gas), for example to help in handling liquid, e.g. in controlling the flow and/or the position of the immersion fluid. The flow of gas may form a seal to confine the immersion fluid so the fluid handling structure may be referred to as a seal member; such a seal member may be a fluid confinement structure. Immersion liquid may be used as the immersion fluid. In that case, the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid.

SUMMARY

After exposure a substrate in a lithographic apparatus, the substrate is removed from a substrate table on which it is supported and a new substrate is placed on the substrate table for exposure. This process is often referred to as substrate swap. Immersion liquid during exposure is confined in a space between a fluid handling structure, the projection system and a facing surface of the substrate table, a substrate or both. It is desirable to retain immersion liquid in the space during, for example, substrate swap. This may be achieved, for example, by having the fluid handling structure located over a shutter member (e.g., by moving the shutter member to under the fluid handling structure). In some designs of an immersion lithography system the shutter member may be located beyond the outer edge of the substrate table, for example the shutter member may be another table (or swap table) or a retractable bridge between substrate table and the other table. The other table may be another substrate table supporting a next substrate for exposure such as in a dual stage lithographic apparatus, or a measurement table which is designed so as not to support a substrate.

Located at the edge of the substrate table which during, for example, substrate swap moves out from under the fluid handling structure, there may be components of a positioning system. For example, in or on the surface of the substrate table near its edge may be a positioning plate, such as an encoder grid. The positioning plate is used to determine the position of the substrate table, and therefore a substrate positioned on the substrate, relative to one or more other components of the lithographic tool, such as the projection system.

As the substrate table, and the shutter member, move relative to the fluid handling structure there is a risk that immersion liquid will be lost from the immersion space to the surface of the positioning plate. Immersion liquid on the positioning plate may interfere with the positioning system and affect its accuracy.

It is desirable to alleviate the aforementioned problem or one or more other problems, whether identified herein or elsewhere, by reducing, if not preventing, the risk of interference of immersion liquid with the positioning system.

According to an aspect, there is provided an immersion lithographic apparatus comprising: a substrate table configured to support a substrate; a fluid handling structure configured to supply and confine immersion liquid to a space defined between a projection system and the substrate table, the substrate, or both; a swap table configured to be located under the fluid handling structure to retain liquid in the space; and a transfer surface configured to be located under the fluid handling structure and between a surface of the substrate table and a surface of the swap table, wherein the transfer surface is configured to prevent immersion liquid moving over at least part of the transfer surface in a direction with a component perpendicular to a direction of relative motion between the fluid handling structure and the transfer surface.

According to an aspect, there is provided a shutter member for an immersion lithographic apparatus, the shutter member having at least part of a transfer surface configured to prevent immersion liquid in a confined space moving over at least part of the transfer surface in a direction with a component perpendicular to a direction of relative motion between the confined space and the shutter member.

According to an aspect, there is provided a device manufacturing method, the method comprising: confining immersion liquid in a space in contact with a surface of a substrate table; replacing the surface of the substrate table with a shutter surface by moving the substrate table and the shutter surface in one motion so that the substrate table moves away from under the fluid handling structure and the shutter surface replaces the surface of the substrate table under the fluid handling structure, wherein in replacing the substrate table with the shutter surface, moving a transfer surface under the fluid handling structure, the transfer surface preventing immersion liquid moving over at least part of the transfer surface in a direction with a component perpendicular to a direction of motion of the transfer surface.

According to an aspect, there is provided a method of operating an immersion lithographic apparatus, the method comprising: supporting a substrate on a substrate table; supplying and confining immersion liquid to a space defined by a fluid handling structure between a projection system and the substrate table, the substrate, or both; replacing a surface of the substrate table under the fluid handling structure with a shutter surface, the shutter surface including a surface of a swap table; moving a transfer surface under the fluid handling structure as the surface of the swap table replaces the surface of the substrate table; and during moving the transfer surface, preventing immersion liquid moving over at least part of the transfer surface in a direction with a component perpendicular to a direction of relative motion between the fluid handling structure and the transfer surface.

According to an aspect, there is provided an immersion lithographic apparatus comprising: a substrate table configured to support a substrate; a fluid handling structure configured to supply and confine immersion liquid to a space defined between a projection system and the substrate table, the substrate, or both; a shutter member configured to be located under the fluid handling structure during swap of the substrate on the substrate table, the shutter member being a swap table, wherein a transfer surface is arranged to be between surfaces of the substrate table and the swap table, the transfer surface configured to be moved under the fluid handling structure and configured to prevent immersion liquid moving over at least part of the transfer surface in a direction with a component perpendicular to a direction of relative motion between the fluid handling structure and the transfer surface.

According to an aspect, there is provided an immersion lithographic apparatus, comprising: a substrate table configured to support a substrate; a fluid handling structure configured to supply and confine immersion liquid to a space defined between a projection system and the substrate table, the substrate, or both; and a transfer surface configured to be located under the fluid handling structure and between a surface of the substrate table and a shutter surface, the shutter surface configured to replace the surface of the substrate table under the fluid handling structure and the transfer surface configured to prevent immersion liquid moving over at least part of the transfer surface in a direction with a component perpendicular to a direction of relative motion between the fluid handling structure and the transfer surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
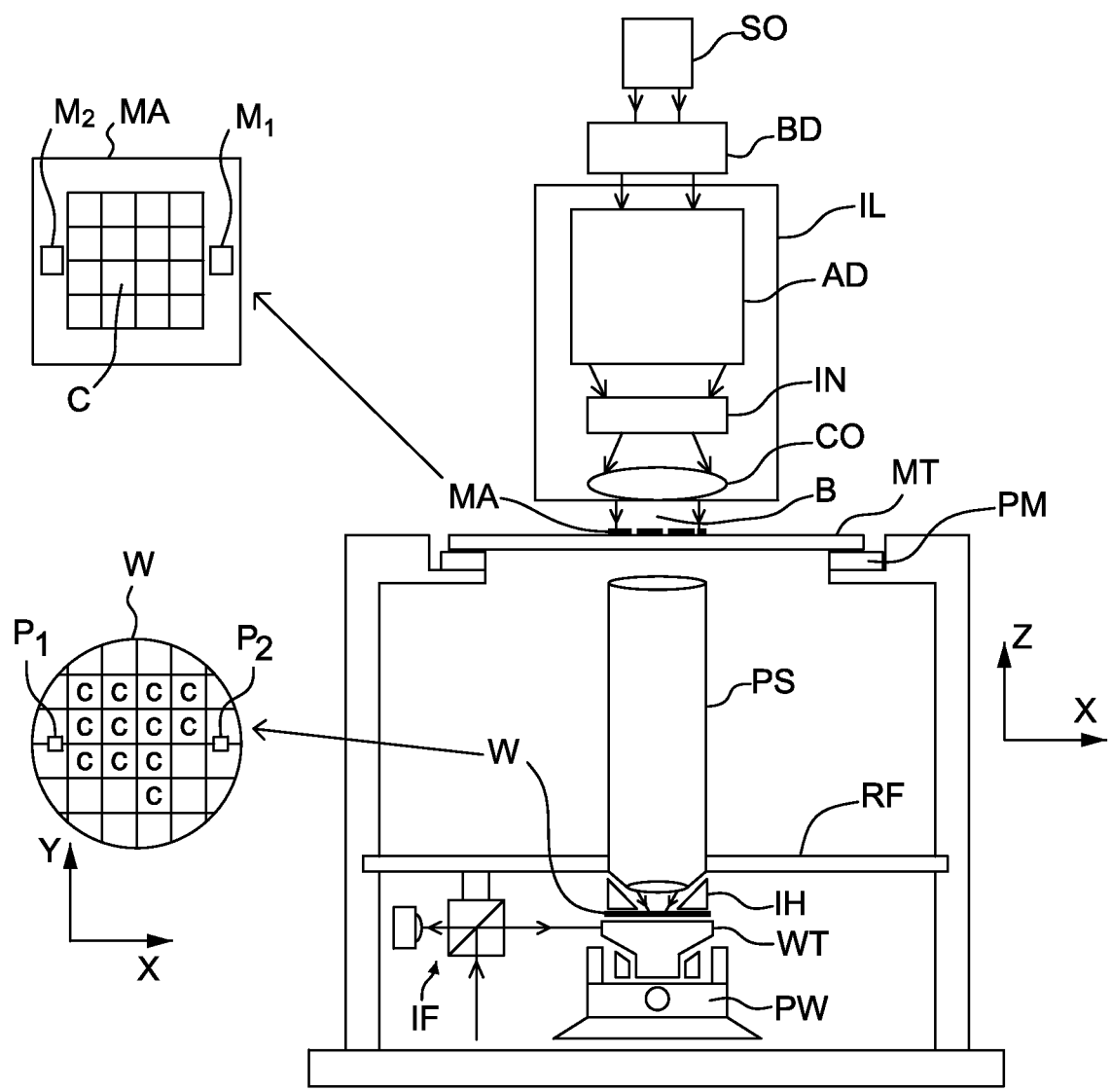
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate and the area filled with liquid remains stationary relative to the projection system PS whilst the substrate W moves underneath that area. FIGS. 2-5 show different supply devices which can be used in such a system. Sealing features are present to seal liquid to the localized area. One way which has been proposed to arrange for this is disclosed in PCT patent application publication no. WO 99/49504.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 may be used in such a system. However, sealing features are not present, are not activated, are not as efficient as normal or are otherwise ineffective to seal liquid to only the localized area.

Figure 2:
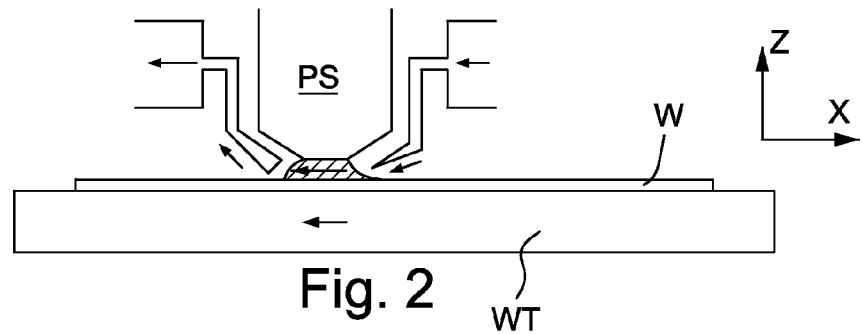
FIGS. 2 and 3 depict a liquid supply system for use in a lithographic projection apparatus.
Figure 3:
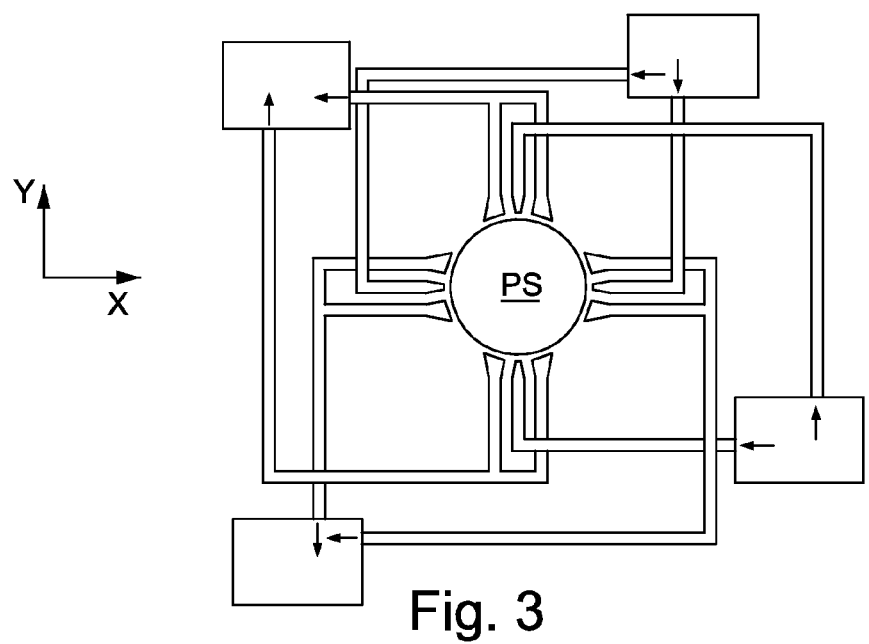

As illustrated in FIGS. 2 and 3, liquid is supplied by at least one inlet onto the substrate, preferably along the direction of movement of the substrate relative to the final element. Liquid is removed by at least one outlet after having passed under the projection system PS. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
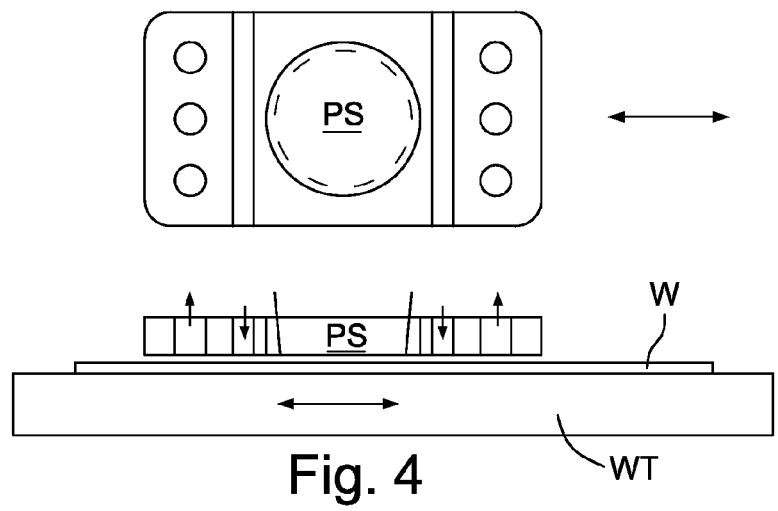
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Another arrangement which has been proposed is to provide the liquid supply system with liquid confinement structure which extends along at least a part of a boundary of the space between the final element of the projection system and the substrate table. Such an arrangement is illustrated in FIG. 5.

Figure 5:
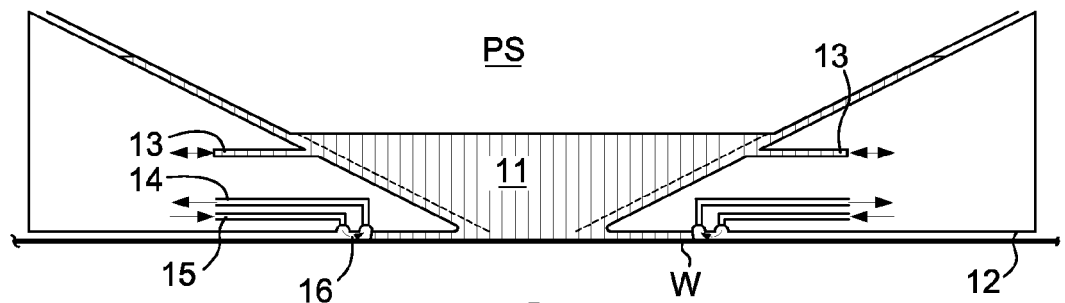
FIG. 5 depicts a further liquid supply system for use in a lithographic projection apparatus.

FIG. 5 schematically depicts a localized liquid supply system or fluid handling structure with a liquid confinement structure 12, which extends along at least a part of a boundary of the space 11 between the final element of the projection system PS and a facing surface (e.g. the substrate table WT or substrate W). (Please note that reference in the following text to surface of the substrate W also refers in addition or in the alternative to a surface of the substrate table WT, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W and may be a contactless seal such as a gas seal (such a system with a gas seal is disclosed in United States patent application publication no. US 2004-0207824) or fluid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may contained in the space 11 by the gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no.

US 2004-0207824, which is hereby incorporated by reference in its entirety. In another embodiment, the liquid confinement structure 12 does not have a gas seal.

Figure 6:
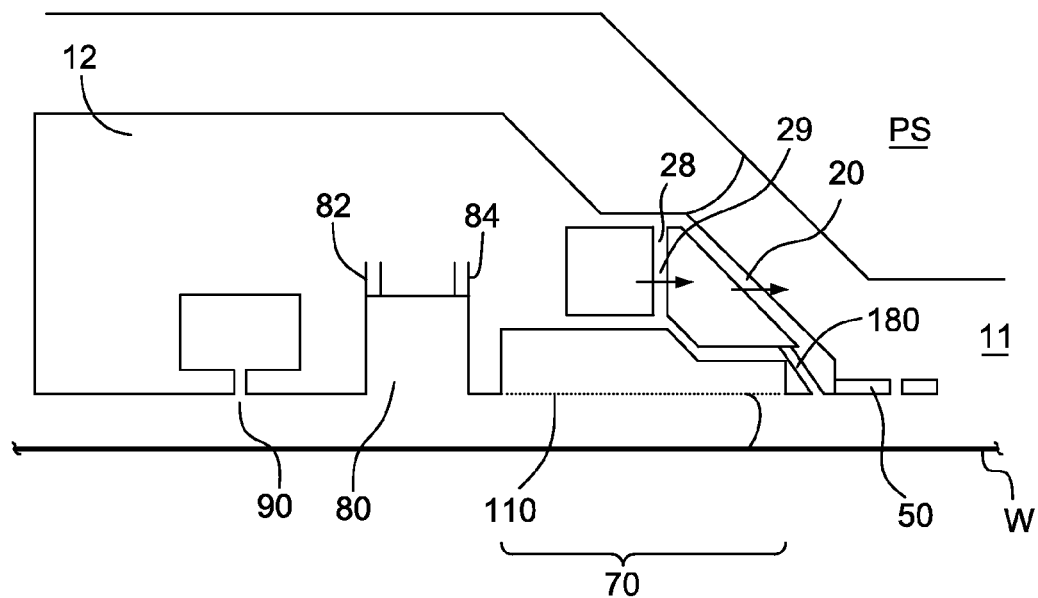
FIG. 6 depicts, in cross-section, a liquid confinement structure and a final element of a projection system according to an embodiment of the present invention.

FIG. 6 illustrates a liquid confinement structure 12 which is part of a liquid supply system. The liquid confinement structure 12 extends around the periphery (e.g., circumference) of the final element of the projection system PS.

A plurality of openings 20 in the surface which defines the space 11 provide the liquid to the space 11. The liquid passes through openings 29, 20 in side walls 28, 21 respectively prior to entering the space 11.

A seal is provided between the bottom of the liquid confinement structure 12 and the substrate W. In FIG. 6 a seal device is configured to provide a contactless seal and is made up of several components. Radially outwardly from the optical axis of the projection system PS, there is provided a (optional) flow control plate 50 which extends into the space 11. Radially outwardly of the flow control plate 50 on the bottom surface of the liquid confinement structure 12 facing the substrate W or substrate table WT may be an opening 180. The opening 180 can provide liquid in a direction towards the substrate W. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid confinement structure 12 and the substrate W and/or the substrate table WT. The extractor assembly 70 may operate as a single phase or as a dual phase extractor.

Radially outwardly of the extractor assembly 70 may be a recess 80. The recess 80 is connected through an inlet 82 to the atmosphere. The recess 80 may be connected via an outlet 84 to a low pressure source. Radially outwardly of the recess 80 may be a gas knife 90. An arrangement of the extractor assembly, recess and gas knife is disclosed in detail in United States patent application publication no. US 2006/0158627 incorporated herein in its entirety by reference.

The extractor assembly 70 comprises a liquid removal device or extractor or inlet such as the one disclosed in United States patent application publication no. US 2006-0038968, incorporated herein in its entirety by reference. In an embodiment, the liquid removal device 70 comprises an inlet which is covered in a porous material 110 which is used to separate liquid from gas to enable single-liquid phase liquid extraction. An under pressure in chamber 120 is chosen is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70.

The porous material 110 has a large number of small holes each with a dimension, e.g. a width, such as a diameter, in the range of 5 to 50 µm. The porous material 110 may be maintained at a height in the range of 50 to 300 µm above a surface from which liquid is to be removed, e.g. the surface of a substrate W. In an embodiment, porous material 110 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. One way of dealing with this liquid is to provide a liquidphobic (e.g., hydrophobic) coating. The coating may form a band around the top of the liquid confinement structure 12 surrounding the opening and/or around the last optical element of the projection system PS. The coating may be radially outward of the optical axis of the projection system PS. The liquidphobic (e.g., hydrophobic) coating helps keep the immersion liquid in the space 11.

The examples of FIGS. 5 and 6 are a so called localized area arrangement in which liquid is only provided to a localized area of the top surface of the substrate W at any one time. Other arrangements are possible, including fluid handling systems which make use of a gas drag principle. The so-called gas drag principle has been described, for example, in United States patent application publication nos. US 2008-0212046, US 2009-0279060 and US 2009-0279062. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in United States patent application publication no. US 2010-0060868.

As will be appreciated, any of the above described features can be used with any other feature and it is not only those combinations explicitly described which are covered in this application.

There is a risk that the meniscus between the fluid handling structure and the facing surface of the substrate may be unstable. Immersion liquid, for example in a localized immersion system, may escape from the immersion space 11. The escaped liquid may take the form of a droplet or a film of liquid. Reference herein to droplet includes reference to film unless indicated to the contrary. Note that in many situations a film would break into one or more droplets as the droplet evaporates, or moves.

A liquid droplet outside the immersion space may pose a risk to operation of an immersion system. A droplet may increase defectivity of an immersion system. Liquid may evaporate from the droplet applying a heat load to the surface on which the droplet is situated. Such a surface could include a sensor where the heat load may distort a component of the sensor, deleteriously affecting accurate measurements. Such a sensor may be part of a positioning system, so distortion of the sensor could affect system positioning and overlay. Where the surface is a surface of a substrate, the heat load may cause the substrate to deform, for example contract the surface, affecting the accurate exposure and hence overlay. The droplet may transport a contaminant, such as a contaminant from a substrate coating, around the immersion system. On evaporating, the droplet may leave a contaminant on a surface of a substrate causing an imaging defect, or a drying stain. The droplet may be situated on a location which later passes under the fluid handling structure. On contact with the meniscus, for example as a collision, the droplet may cause the formation of a bubble within the immersion space. Such a bubble may interfere with exposure affecting the successful imaging of a pattern on a substrate during exposure.

A droplet may pose a particular risk to a multi-stage (or multi-table) immersion lithographic tool. For example, the droplet may be lost from the immersion space 11 during substrate swap (i.e., the process by which a substrate is replaced after exposure) when an immersion liquid is kept in contact with the projection system PS. For example, at the beginning of substrate swap, the substrate table WT supporting the substrate W is under the fluid handling structure 12. A surface of the substrate table helps serve to form the space 11. The substrate table WT is moved to a position at which the substrate W can be removed and a new substrate placed on the substrate table for exposure. As the substrate table is moved, it moves away from the projection system PS, from under the fluid handling structure 12. To keep immersion liquid in the space 11, the surface of the substrate table is replaced by a shutter surface of a shutter member. The shutter surface and the substrate table may be moved in together in one motion. From the perspective of the immersion space 11, the shutter surface and the surface of the substrate table serve to provide a substantially continuous surface. The shutter surface helps serve to form the space 11.

The shutter surface may take the form of a surface of a second table, such as a swap table. The second table may be a further substrate table WT2 as shown in FIGS. 7, 8, 10 and 11, or a measurement table MT as shown in FIGS. 9 and 12. The measurement table MT is designed not to support a substrate W; so, the measurement table may be considered to be unable to support a substrate W. The measurement table may have one more optical sensors 21 to detect a property of the projection system. It may have a cleaning station 22 to clean the surface of the projection system in contact with immersion liquid, or a feature of the fluid handling structure 12, or both.

Figure 7:
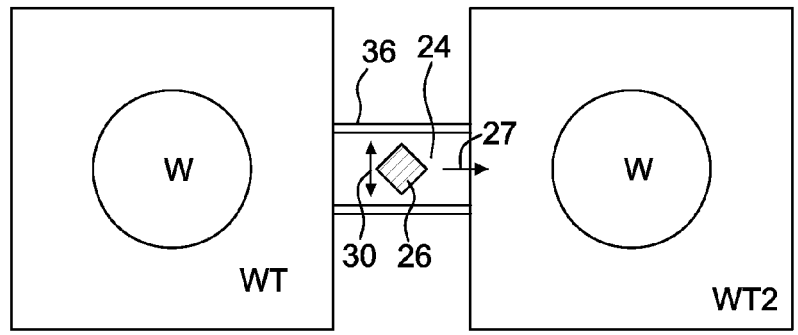
FIG. 7 depicts schematically, in plan, a dual stage arrangement with two substrate tables according to an embodiment of the invention.
Figure 8:
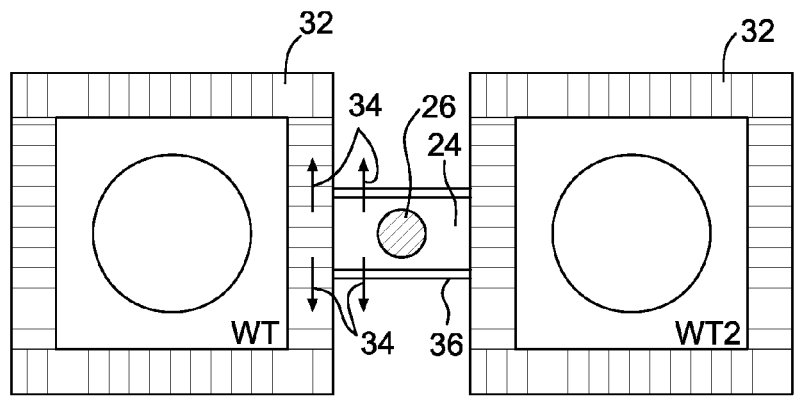
FIG. 8 depicts schematically, in plan, a dual stage arrangement with two substrate tables according to an embodiment of the invention.
Figure 9:
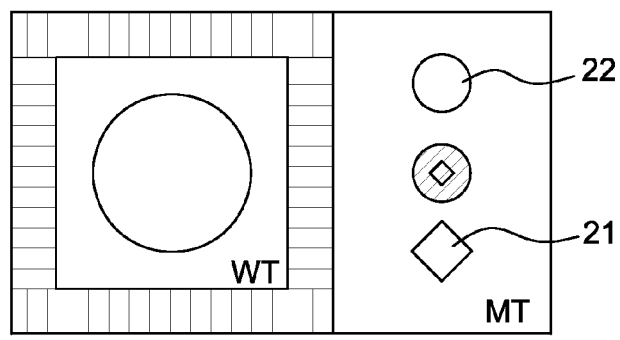
FIG. 9 depicts schematically, in plan, a dual stage arrangement with a substrate table and a measurement table according to an embodiment of the invention.

In an embodiment, the tables WT, WT2, MT may not meet, as shown in FIGS. 7, 8 and 12. When the tables are positioned to be as close as possible, there may be a gap between them. This may be desirable to prevent collision between the tables. It is more likely that the tables do not meet if both are substrate tables as shown in FIGS. 7 and 8 because substrate tables may be required to be positioned more accurately than a measurement table to achieve accurate positioning of the substrate. Accurate positioning of a table may require a large positioning system to be associated with the table, making the table difficult to position closely next to another substrate table. The accurate positioning equipment may be more sensitive and thus more at risk of damage on collision.

In an embodiment, the shutter surface may take the form of a fixed extension or moveable extension (e.g., a telescoping arm) of the substrate table WT. In an embodiment, the shutter surface may take the form a closing plate or disk that is separable from the tables WT, WT2, MT and that may be connected to the fluid handling structure while the tables WT, WT2, MT move with respect thereto.

The shutter surface may include a removable bridge 24 to bridge the gap between the surfaces of the tables (as described in U.S. patent application publication no. US 2009/0296065, which is hereby incorporated by reference in its entirety). The removable bridge 24 may be positionable between the tables WT, WT2, MT during, for example, substrate swap. The surface of the bridge 24 is moved under the fluid extraction surface, as represented by a liquid footprint 26 as shown in FIGS. 7 and 8.

The liquid footprint 26 may represent an area of the substrate, substrate table WT or shutter member which is in contact with the immersion liquid of the space 11 at a moment in time. With respect to the surfaces of the tables WT, WT2, MT and the removable bridge 24, the liquid footprint moves from one table to the other over the removable bridge 24, as shown by arrow 27. (In the frame of reference of the projection system PS and the fluid handling structure it is the tables WT, WT2, MT and the removable bridge which are moving.) The liquid footprint has a dimension, i.e. width 30, which is substantially perpendicular to the direction of relative motion 27.

In an embodiment, an edge of the substrate table WT, for example the entire periphery of the substrate table WT, may be part of a positioning system configured to position the substrate table WT, and thus substrate W, relative to the projection system PS. The part of the positioning system may be a positioning plate with one or more positioning markers, such as an encoder grid 32, along the edge of the substrate table WT.

Figure 11:
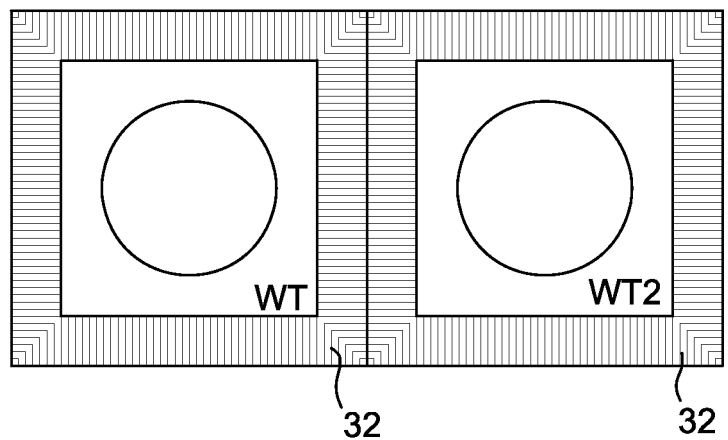
FIG. 11 depicts schematically, in plan, a dual stage arrangement with two substrate tables according to an embodiment of the invention.
Figure 12:
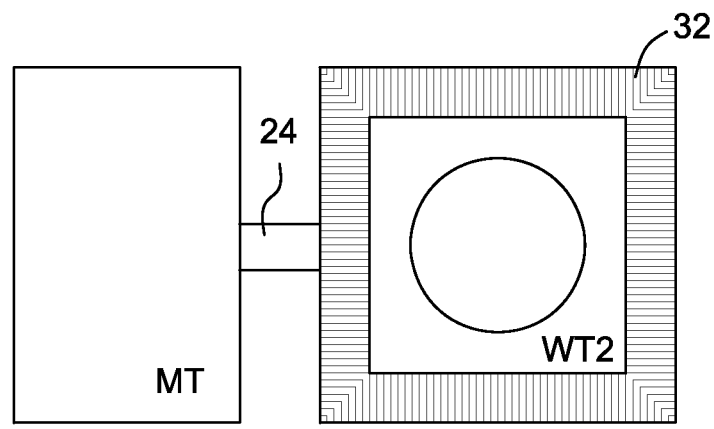
FIG. 12 depicts schematically, in plan, a dual stage arrangement with a substrate table and a measurement table according to an embodiment of the invention.

FIGS. 8, 9, 11 and 12 all show different arrangements in which the substrate table has an encoder grid 32 along all or part of its edge. FIG. 8 shows a dual substrate table arrangement with a removable bridge 24 in which both substrate tables have an encoder grid along their edges. In FIG. 12 there is a substrate table with an encoder grid and a measurement table MT with a removable bridge therebetween. The measurement table MT may have an encoder grid. Note that where accurate positioning of the measurement table is not required it may not be desirable to have a measurement table with an encoder grid. Accurate positioning is desirable for the substrate table WT, WT2 as accurate positioning is required for exposure of an image onto a substrate. FIGS. 9 and 11 are the same as FIGS. 8 and 12, respectively, except without the removable bridge.

In exchanging tables beneath the fluid handling structure 12, as shown in FIG. 8, the liquid footprint 26 crosses the encoder grid 32. An encoder grid 32 operates with an encoder sensor positioned in a different frame of reference such as the same frame of reference as the projection system. As the substrate table moves, the encoder sensor may sense the relative movement of the substrate table. The sensor may direct a radiation beam at the encoder grid and detect the radiation redirected (e.g., reflected) back by the encoder grid 32.

To work effectively it is desirable that the surface of the encoder grid 32 is clean. So it is undesirable that a droplet escapes from the immersion space 11 onto the grid. The droplet may be source of defectivity, for example in distorting a dimension of the grid and/or obstructing the radiation beam of the encoder sensor either as a droplet or in the form of a contamination particle the droplet may have left behind. Liquid cannot be prevented from contacting the grid during, for example, substrate swap as the liquid footprint 26 passes over the surface of the grid 32. A droplet may escape from the immersion space 11 in any direction of the surface surrounding the liquid footprint 26.

It would be desirable to help prevent a droplet from escaping onto the surface of the grid, especially in a direction 34. Direction 34 has a component perpendicular to the direction of relative motion 27. Where a removable bridge 24 is used to bridge a gap between two tables, there is a risk that a droplet escaping in direction 34 may cross an edge 36 of the removable bridge 24. A droplet crossing the edge 36 escapes the immersion system and may land on a component which is unsuited to contacting immersion liquid. The liquid may damage the component. It is therefore desirable to provide a transfer lane 38 which restricts the motion of a droplet escaping from the immersion space to move in direction 34.

Figure 10:
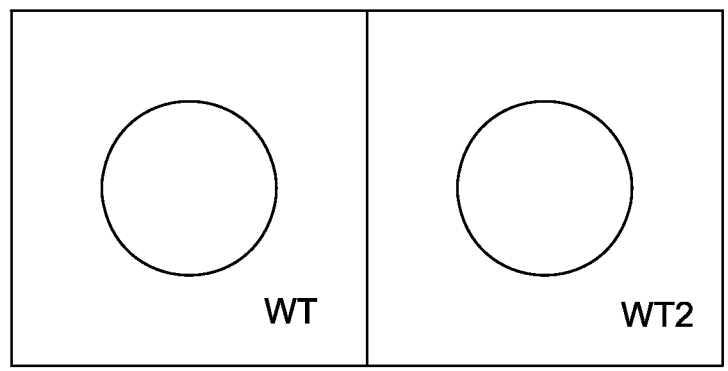
FIG. 10 depicts schematically, in plan, a dual stage arrangement with two substrate tables according to an embodiment of the invention.
Figure 13:
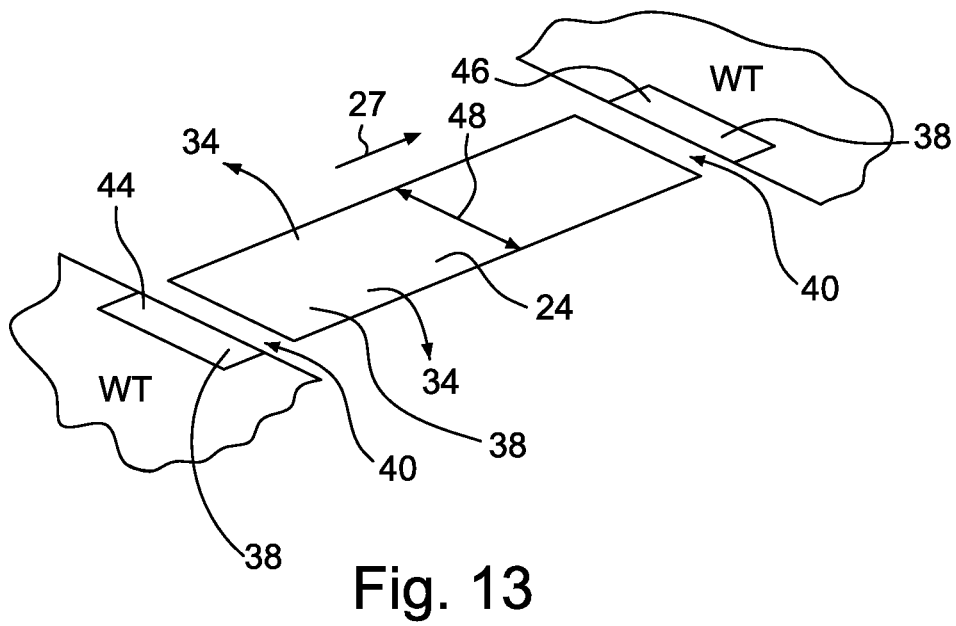
FIGS. 13, 14 and 15 depict schematically, in perspective, further detail of the three types of transfer lane depicted in FIGS. 7 to 12.
Figure 14:
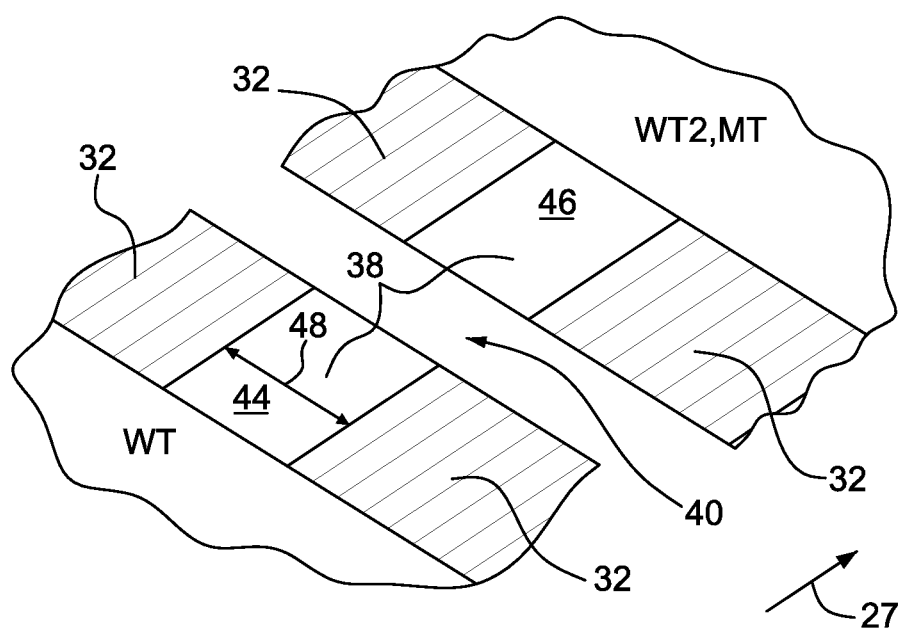
Figure 15:
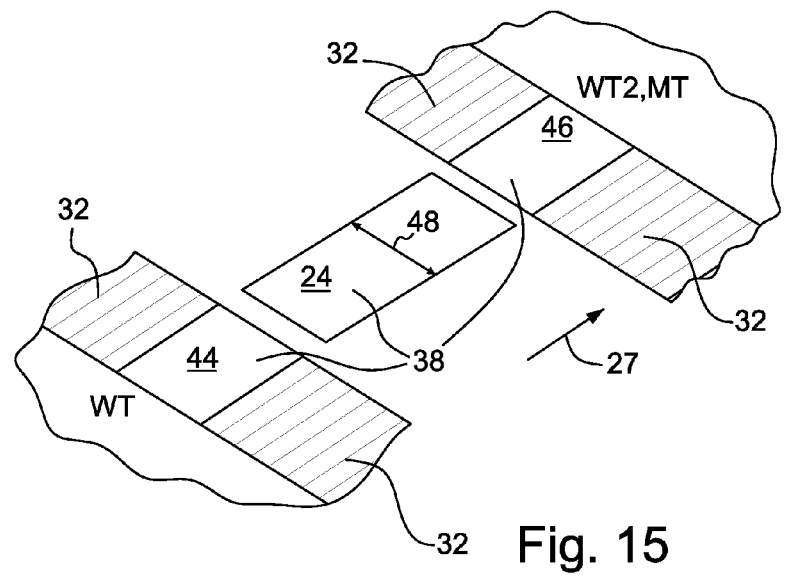

FIGS. 13, 14 and 15 show three different embodiments of transfer lane 38 which may be present in the embodiments shown in FIGS. 7 to 12. In FIG. 13, a removable bridge 24 is located between two tables WT, MT, WT2. Neither of the tables WT, MT, WT2 has a grid 32 along its edges. This embodiment may be present in FIG. 7. The embodiment of FIG. 10 is the same as described here, except without the removable bridge 24. The surface of the removable bridge 24 provides at least a part of the surface of the transfer lane 38 (or transfer surface). A portion 44, 46 of each table WT, MT, WT2 aligned with the surface of the removable bridge 24 may each provide a part of the surface of the transfer lane 38. The portions 44, 46 may have the same surface features of the rest of the transfer lane 38, i.e., the surface of the removable bridge. Between one or both tables WT, MT, WT2 and the removable bridge 24 may be a gap 40 which is either sealed during relative motion 27 to prevent liquid passing into the gap or has a fluid extraction device to remove any liquid which flows into the gap.

FIG. 14 shows the transfer lane 38 of the embodiment shown in FIG. 8. It has the same features as FIG. 13 except as described otherwise. In this embodiment an encoder grid 32 is present along the edge of the substrate table WT and is optionally present on the edge of the other table WT2, MT. It corresponds to the embodiments shown in FIGS. 9 and 11. A removable bridge 24 is not present so the surface of the transfer lane 38 is provided by edge portions 44, 46 of the two tables WT, WT2, MT. Between the tables WT, MT, WT2 may be a gap 40 which is either sealed during relative motion 27 to prevent liquid passing into the gap or has a fluid extraction device to remove any liquid which flows into the gap.

FIG. 15 shows a combination of the embodiments shown in FIGS. 13 and 14. It may correspond to a part of the embodiments shown in FIGS. 8 and 12 which have a removable bridge 24 and at least one of the tables MT, WT, WT2 has an encoder grid 32 along an edge which in use moves under the fluid handling structure 12. The transfer lane 38 has at least three elements: the surface of the removable bridge 24 and the surface of the portions 44, 46 of each table WT, WT2, MT aligned with the removable bridge 24.

In each embodiment, each part of the transfer lane 38 (which may include at least one surface selected from: the surface of the removable bridge 24, the portion 44 and/or the portion 46) may be located under the path of a liquid footprint 26 during substrate swap. The transfer lane 38 has a width 48 which is at least as wide as the liquid footprint 26. As shown the transfer lane 38 may be as wide as the removable bridge, but to prevent a droplet from moving beyond an edge of the removable bridge the width of the removable bridge may be larger than the width 48 of the transfer lane 38.

The transfer lane 38 may have a lyophobic surface with respect to the immersion liquid, for example it may be hydrophobic when the immersion liquid is water. The surface of the transfer lane 38 may have a relatively high contact angle, for example more than 90 degrees as a static contact angle, or more than 75 degrees as a receding contact angle, which helps to prevent a droplet from remaining on the surface of the transfer lane 38. Such a surface may improve the ease of control of the meniscus between the fluid handling structure and the surface of the transfer lane 38. The surface may be resistant to the exposure radiation, or corrosion by the immersion liquid, or both. The surface contact angle may therefore retain its contact angle under the influence of exposure radiation and immersion liquid corrosion, separately or in combination. The surface may be a coating as described in U.S. patent application publication no. US 2009/0206304, which is hereby incorporated by reference in its entirety.

To prevent a droplet from moving in direction 34, the transfer lane 38 may have a barrier. The barrier may prevent motion in the direction 34. As described herein the barrier may include the feature of a surface coating, or a topographical feature, or a fluid extraction device, or any combination of the foregoing. The transfer lane 38 may have two barriers. Each barrier may be substantially parallel to the transfer lane, may be substantially parallel to the direction of relative motion 27, or both. In an embodiment each barrier is associated, e.g. substantially aligned, with an edge of the transfer lane 38. The barriers may define the width 48 of the transfer lane.

FIGS. 16 to 19 show different embodiments of transfer lanes with a barrier. The Figures are intended to indicate possible embodiments of transfer lane 38 with the barrier. It is not intended that all possible embodiments are limited to those represented in these Figures. In FIGS. 16 to 19, 'A' denotes the position of the gap 40 between the two portions 44 and 46 of the embodiment shown in FIG. 14. 'B' denotes the positions of the gaps 40 between the removable bridge 24 and each of the portions 44 and 46.

Figure 16:
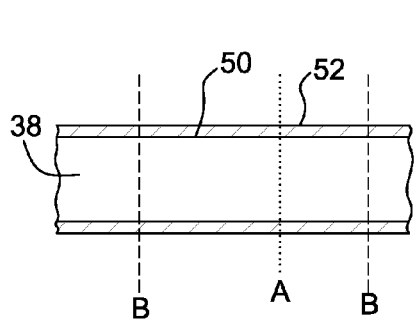
FIG. 16 depicts, in plan, a transfer lane according to an embodiment of the invention.

FIG. 16 depicts in plan a transfer lane 38 with a barrier 50. There is a barrier associated with each edge 52 of the transfer lane 38. In an embodiment, each barrier 50 is a ridge, or protrusion. In an embodiment, the barrier 50 may be located at an edge 52. In an embodiment, a barrier 50 is located inwardly from an edge 52; the distance between the two barriers 50 on opposite sides of the transfer lane 38 is at least as the width of the liquid footprint 26. This is desirable because contact of a barrier 50 with the liquid meniscus of the footprint 26 may pin the meniscus and increase the risk of droplet loss. The surface of the barrier 50 may protrude above the surface of the transfer lane 38 so as to help to block the flow of immersion liquid towards or past the edge 52. A raised barrier 50 may have a sharp corner in profile in a direction perpendicular to the direction of relative motion 27. The corner may help serve to pin the meniscus of a droplet of immersion liquid, helping to prevent it from flowing towards or past an edge 52. An edge 52 may correspond in part to the edge 36 of the removable bridge 24. In an embodiment, the barrier 50 may be an edge 52 with a sharp corner preventing liquid from flowing over the edge 52.

In an embodiment, the barrier member 50 may have a recess 56 (or groove) recessed relative to the surface of the transfer lane 38. The recess may have a sharp corner, in profile, to pin an immersion liquid meniscus, for example, of a droplet. The corner of the recess may function in the same manner as a ridge in helping to prevent the flow of the immersion liquid away from footprint 27 towards or past an edge 52.

Figure 17:
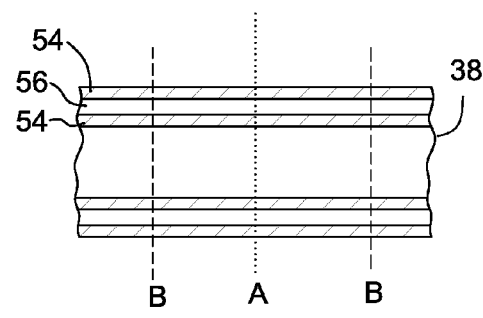
FIG. 17 depicts, in plan, a transfer lane according to an embodiment of the invention.

In an embodiment, as shown in FIG. 17, the barrier 50 may have a plurality of ridges 54 each of which may have the features as described with respect to the embodiment of FIG. 16. Between adjacent ridges there may be at least a recess 56. In an embodiment the barrier 50 may have a plurality of recesses 56 and at least a ridge 54. A plurality of parallel features (e.g., recess 56 and/or ridge 54) may help prevent a droplet from reaching the edge 52 of the transfer lane 38. If the droplet passes beyond a first feature in the barrier 50 in direction 34, a feature closer to the edge 52 may prevent the droplet moving closer to the edge 52. As liquid meniscus is pinned by a corner of a recess or ridge, it may be desirable to have more than one recess or ridge. The recess and ridge corners further towards the edge 52 of the transfer lane 38 may serve to help prevent liquid, which passes a recess or ridge corner further from the edge 52, from reaching the edge 52.

In an embodiment, the surface of a recess or ridge protrudes not more than 2 mm above the surface of the transfer lane 38. So that the pinning of the edges of the recess and/or ridge is achieved, the surface of a recess or ridge protrudes at least 10 μm above the surface of the transfer lane 38. In an embodiment, such as for a localized immersion system, the surface of the barrier is in the range of 10 μm to 150 μm, desirably in the range of 20 μm to 100 μm. The reason for the low maximum in this embodiment is to help avoid machine damage caused by a collision between the confinement structure 12 and the surface of the transfer lane 38. In an embodiment, a machine damage control system is present which may operate to help ensure the confinement structure 12 avoids, and so does not collide with, the surface of the transfer lane 38.

Although this part of the description refers to topographical features, the barrier 50 may additionally or alternatively have a feature which is formed by a variation in surface contact angle. For example, there may be region of increased lyophobicity (e.g., hydrophobicity) 50' to pin immersion liquid, helping to prevent the liquid from reaching or moving past the edge 52. There may be an area of reduced lyophobicity (e.g., hydrophobicity) 50' (i.e., increased lyophilicity (e.g., hydrophilicity)) to retain immersion liquid. The region of increased lyophilicity may be provided by a photo-catalytic material such as titanium oxide, as described in U.S. Pat. No. 7,450,217 and U.S. patent application publication no. US 2010-0060870, both of which are hereby incorporated in their entirety by reference. One or more regions of differing lyophobicity may be arranged in parallel elongate regions as shown in and described with reference to FIG. 17 for topographical features.

In an embodiment, the use of a barrier 50 is suitable for use in an all-wet immersion system. In an all wet system the liquid confinement structure 12 allows liquid to escape from the space between under the undersurface of the liquid confinement structure 12. The barrier 50 helps prevent immersion liquid from escaping past the edge of the transfer lane 38 as the transfer lane moves under the liquid confinement structure 12. In operation of such an arrangement the liquid supply may be reduced or even stopped as the transfer lane passes under the liquid confinement structure 12. Once the transfer lane has passed under the confinement structure 12 it is replaced by the surface of a table WT2, MT where the supply of immersion liquid is increased, for example returned to its previous rate of supply. As more liquid may flow out of the liquid confinement structure 12 of an all-wet immersion system than of a localized immersion system, the dimensions of the barrier 50 may be larger than in a localized immersion system. For example the distance between ridges or recesses may be between 0.01 and 1 mm, and their height may be in the range of 10 μm to 1 mm, for example 0.5 mm.

Figure 18:
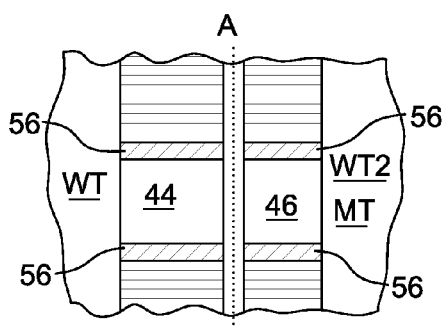
FIG. 18 depicts, in plan, a transfer lane according to an embodiment of the invention.
Figure 19:
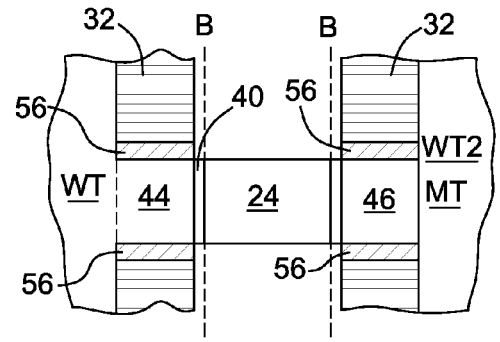
FIG. 19 depicts, in plan, a transfer lane according to an embodiment of the invention.

FIGS. 18 and 19 show embodiments having fluid extraction features. FIG. 18 shows two tables without a removable bridge 24. The transfer lane 38 is defined by two portions 44, 46, one of each table WT, MT, WT2. At the edge of the transfer lane is a fluid extraction opening 56 for the extraction of a fluid including immersion liquid. Each fluid extraction opening 56 is arranged to extract liquid which may move from the transfer lane 38 with in direction 34. Thus liquid moving in direction 34 is removed before it moves off the transfer lane onto, for example, the surface of a grid 32. In an embodiment, the fluid extraction opening 56 may be formed in or on the top of a ridge 54.

Each extraction opening 56 is formed in the surface of the respective table WT, WT2, MT and may be connected to an underpressure source (not shown). The underpressure source may operable as the portion 44, 46 adjacent the fluid extraction opening 56 passes under the fluid handling structure 12. Limiting the operation of the fluid extraction opening 56 in this way means that extraction flow only occurs when it is required. This may be desirable because the extraction flow may apply a heat load to the opening and the surrounding part of the table WT, WT2, MT, especially when the fluid flow comprises liquid and gas in a two phase flow. The liquid may evaporate into the gas in the two phase fluid, applying a heat load, for example, by absorbing heat from its surroundings. By supplying heat, the surroundings which form part of the lithographic apparatus may distort. To counteract the heat load, a conduit connecting the fluid extraction opening 56 to the underpressure source may be insulated from the surroundings. To achieve this the adjacent portion 44, 46 may be insulated.

Additionally or alternatively a heat source such as a heat pipe or heating element may be present in the table around the fluid extraction opening 56 to counteract the heat load. A controller with a temperature sensor may be present with heat source to ensure that the heat applied is regulated, a stable temperature is achieved or both. The heat source may be located at least under the portions 44, 46. It may be desirable for the portions 44, 46 to have a controlled heat source and or be insulated as such features can be used to counteract a heat load applied by a droplet remaining on the transfer lane 38 after passing under the liquid footprint.

FIG. 19 shows the same features as FIG. 7, except with a removable bridge 24. In an embodiment, the surface of the removable bridge is not insulated from the rest of the bridge and does not have a controlled heat source. In another embodiment the surface is insulated from the rest of the bridge 24, the bridge has a controlled heat source, or both.

In each of the embodiments shown in FIGS. 13 to 19, the surface of the transfer lane 38 or at least a portion of the transfer lane 26, 44, 46 may have a one dimensional lyophobic surface, such as a one dimensional superhydrophobic surface. Such a surface may have a ridged structure with the ridge pitch of between 100 and 1000 nm. A roughness factor (Rf) may be defined as the ratio between the area of a surface which contacts a liquid droplet resting on the surface and the area of the surface which the droplet covers. For an embodiment of the surface, the roughness factor may be greater or equal to one, desirably less than 1.5 and close to one. The width of a ridge may be approximately, if not substantially, the same as the width of a recess or groove between two adjacent ridges. In an embodiment, the width of the ridge is exceeded by the width of the recess or groove between two adjacent ridges. The width of a ridge may be less than the height or depth of the ridge. In an embodiment the width of a ridge is in the range of 0.4 to 0.6 of the height or depth of a ridge. In an embodiment the height of a ridge may be twice as large as the width of a ridge. The width of the ridges, at or near the top of the ridges (which would contact the liquid of a droplet resting on the surface), is in the range of 50 nm to 50 μm, desirably less than 20 μm, less than 10 μm, less than 5 μm, or less than 1000 nm (i.e. submicron). Such a ridged or grooved surface may exhibit a greater lyophobic property along one direction in the plane of the surface than in a perpendicular direction in the plane.

Desirably, the orientation of maximum lyophobicity corresponds to the direction perpendicular to the relative movement between the liquid confinement structure 12 and the respective table MT, WT, WT2, as shown by arrow 27. The direction of arrow 27 may correspond to the direction of the ridged structure of the surface. In the reference frame of motion of the transfer lane 38, as the footprint 26 travels over the transfer lane 38, the meniscus of the footprint travels along the ridges and grooves of the textured structure on the transfer lane surface. Since the movement of the transfer lane 38 under the space 11 is in the direction of arrow 27, the maximum lyophobic property that the surface may exhibit relative to the liquid in the space 11 may occur during such relative motion. By having such a one dimensional surface, the desired lyophobic property of a surface may be exhibited in a direction where its use is most desirable. Desirably, a higher relative motion between the projection system and the facing surface may be achieved with a certain liquid loss. At a certain velocity of relative motion the meniscus stability is improved and the risk of bubble inclusion into the liquid of the immersion space 11 may be reduced.

In an embodiment, the surface of a one dimensional lyophobic surface is ridged. The grid 32 also has a ridge like surface where the ridges are periodic, desirably with a determined, regular spacing. Therefore the intrinsic surface geometry of the grid 32 may provide the surface with a lyophobic property as well as the measurable geometry. Since a ridge should be desirably twice as deep as wide to achieve the desired effect with an immersion liquid of water, a ridge width of 10 µm may have a depth of 20 µm. A ridge geometry with shallower depth may provide a surface with less lyophobic surface. Material used to make the grid 32, for example a Zerodur® ceramic, may normally have a lyophilic contact angle. To ensure that the surface of the grid is lyophobic, the grid 32 may have a lyophobic coating that is less than 100 nm, desirably less than 40 nm, for example in the range of 1 to 20 nm. The coating thickness is desirably small to reduce the loss in optical transmission through the coating. The coating may be conformal, i.e. conforming to the topography of the surface onto which it is applied or located.

In an embodiment, the surface which interacts with the immersion liquid is an optically transparent plate which covers the grid 32. The plate is desirably transparent for the operating wavelength of the encoder sensor. A material such as a glass or quartz may be used to make the plate. The surface of the plate may be formed of sub-micron (e.g. with pitch 10 to 100 nm) texture formed from a coating. There may be a risk that such a structure may interfere with radiation used for encoder measurement. However, the structure may have features dimensioned relative to the wavelength of the encoder radiation so that it does not interfere with the encoder radiation. Care may be taken because a structure with the described pitch range may be at risk of causing contamination and/or of being contaminated, preventing effective functioning of the encoder measurement. The structure may be of a submicron scale. A contaminating particle from a substrate coating may tend to be larger, of a micron scale. Therefore a particle larger than the width of a submicron structure such as a groove (or other recessed structure) is less likely to contaminate such a submicron feature than a micron scale feature of the structured surface.

Figure 20:
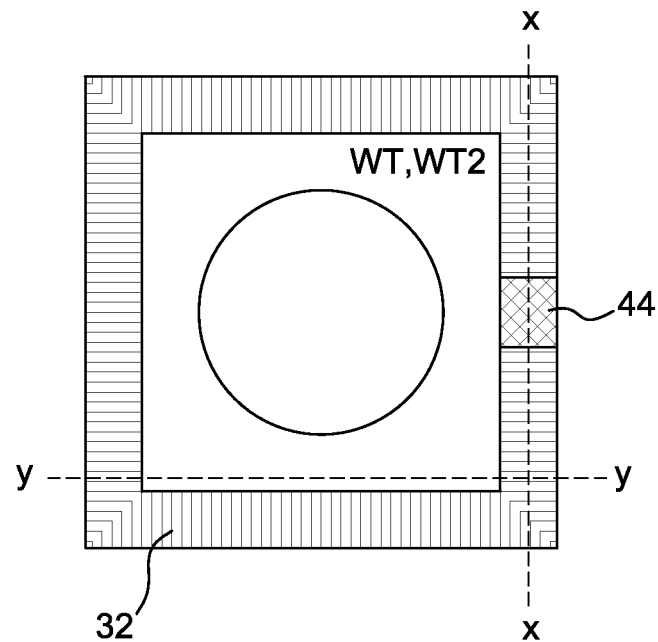
FIG. 20 depicts schematically, in plan, a substrate table according to an embodiment of the invention as shown in FIGS. 8, 9, 11 and 12.

FIG. 20 is a plan view of a substrate table WT, WT2 with a grid 32. In an embodiment, the grid is present along each edge of the substrate table. The portion 44, 46 of the transfer lane 38 crosses a part of the grid along an edge of the substrate table. As there is a risk that a droplet, resulting contamination, or both remains on the portion 44, 46 after it passes under the fluid handling structure, performance of the part of the grid 32 corresponding to the portion 44, 46 may be detrimentally affected. It may prevent accurate positioning to be achieved from measurements to be made from that part of the grid 32.

Figure 23:
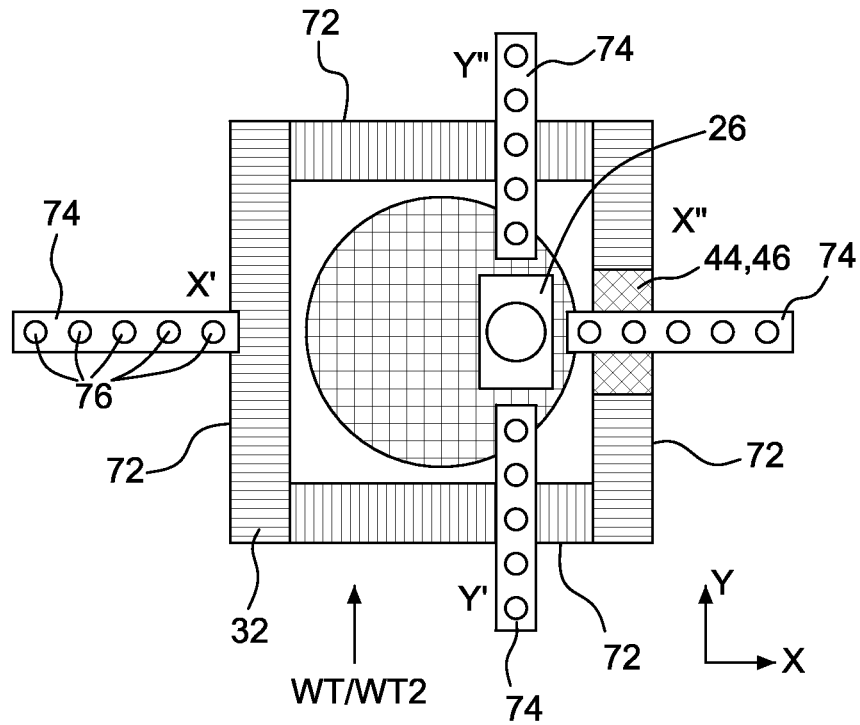
FIG. 23 depicts schematically, in plan, a substrate table with an arrangement of sensor encoders.

FIG. 23 shows an arrangement of a substrate table WT, WT2 with a grid 32 around its periphery. The substrate table WT, WT2 has four edges 72. Associated with each edge 72 is a portion of the grid 32. Associated with each edge 72 is an encoder sensor 74. The encoder sensors 74 each may have a plurality of detectors 76 which may be arranged in a column. The column may be located perpendicular to the associated substrate table edge 72. As the substrate table WT, WT2 is moved, different one or more of the detectors 76 in the encoder sensor 74 may be used to detect the location of the associated grid 32 and therefore the location of the substrate table. By having an encoder sensor 74 associated with opposite edges 72 of the table (for example, edges X' and X" which indicate the portion of the table which can achieve maximum displacement along an X axis relative to the projection system), one of the encoder sensors 74 associated with one or both edges X' and X" will be located over a portion of the grid 32 whatever the position of the substrate table WT, WT2. The same applies to the encoder sensors 74 associated with the edges 72 aligned with the orthogonal axis in the plane of the substrate table WT, WT2, for example edges Y' and Y" of the substrate table, when moved relative to the projection system. By measurements made with an encoder sensor 74 in the X axis and an encoder sensor 74 in the Y axis, the location of the substrate table WT, WT2 relative to the projection system in the plane of the surface of the substrate table WT, WT2 may be determined.

As shown in FIG. 23 a portion of the grid 32 on the X' edge of the substrate table WT, WT2 is not beneath a detector 76 of the associated encoder sensor 74. Therefore the measurement in the X axis should be made using the grid on the X" edge of the substrate table WT, WT2. However, when the portion 44, 46 of the transfer lane 38 crosses the grid 32, a part of the grid 32 may be covered by a droplet or a contaminating particle may obscure part of the grid 32 so a measurement of the grid 32 cannot or should not be made by the encoder sensor 76 on the X" edge.

Figure 24:
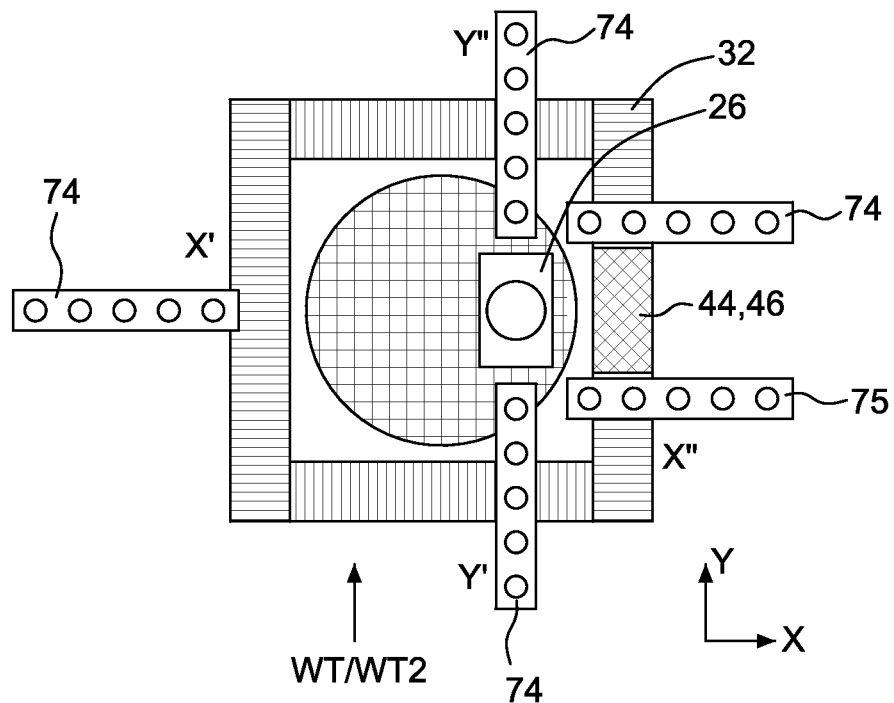
FIG. 24 depicts schematically, in plan, an embodiment of the invention having a substrate table with an arrangement of encoder sensors.

To help prevent inaccurate positioning, measurements may be taken from locations of the grid 32 away from the transfer lane 38. To ensure accurate positioning is still achieved, an extra encoder sensor 75, or a reserve sensor, may be used. The reserve sensor 75 may have the same features as the encoder sensor 74 of the X" edge, except that it is displaced from the X" encoder sensor 74 by a distance which at least exceeds the width of the transfer lane 38 along the X" edge. The reserve sensor 75 may operate when the X" encoder sensor 74 is located above the portion 44, 46 (and vice versa the X" encoder sensor 74 may operate when the reserve sensor 75 is located above the portion 44, 46). Such an arrangement is shown, for example, in FIG. 24 in which the X" encoder sensor 74 and the reserve sensor 75 are spaced away from the projection system in the Y axis, along the X" edge 72 by a similar distance. The use of the reserve sensor 75 obviates the need to take measurements from a part of the grid 32 located in the transfer lane 38 and/or by an encoder sensor 74 located on the X' edge.

Figure 21:
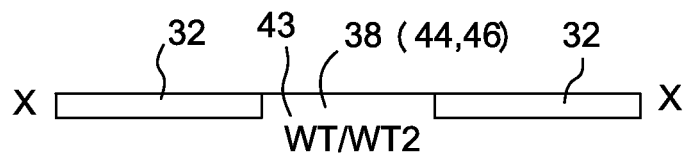
FIG. 21 depicts schematically, in cross-section, an embodiment of the substrate table shown in FIG. 20 along the line X-X.
Figure 22:
FIG. 22 depicts schematically, in cross-section, an embodiment of the substrate table shown in FIG. 20 along the line Y-Y.

In an embodiment, the portion 44, 46 may be opaque to the radiation used by the positioning system for the detectors to detect the grid 32. In an embodiment, the grid 32 is absent from the transfer lane 38. As the use of the reserve sensor 75 and/or the encoder sensor 74 located on the X' edge obviates the need to take measurements from the portion of the grid plate 32 in the transfer lane 38, there can be a gap 43 in the grid 32 corresponding to the transfer lane 38. Such an embodiment is shown in FIG. 21 which corresponds to a cross-section of the substrate table WT, WT2 along the line X-X. The surface 60 of the substrate table WT, WT2 (hereinafter referred to as the surrounding surface 60) is substantially the same height as the transfer lane 38. FIG. 22 shows a cross-section of the substrate table WT, WT2 along the line Y-Y. The surface 60 of the substrate table WT, WT2 is substantially co-planar with the surface of the grid plate 32, as shown in FIG. 22. In this arrangement a droplet escaping from the space 11 may be on the surface of the transfer lane 38 and might not interfere with a positioning measurement of the grid 32.

Figure 25:
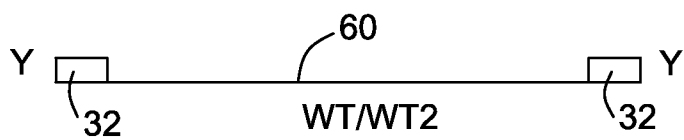
FIG. 25 depicts schematically, in cross-section, an embodiment of the substrate table shown in FIG. 20 along the line Y-Y.
Figure 26:
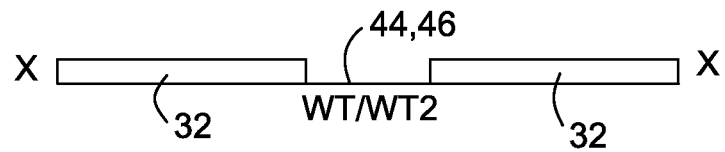
FIG. 26 depicts schematically, in cross-section, an embodiment of the substrate table shown in FIG. 20 along the line X-X.
Figure 29:
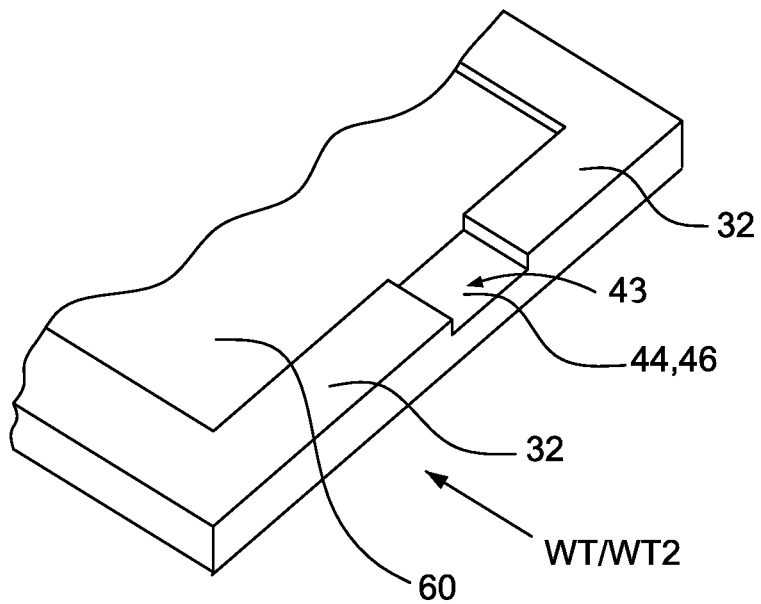
FIG. 29 depicts schematically, in perspective, the embodiment shown in FIGS. 25 and 26.

FIGS. 25 and 26 refer to the same features as FIGS. 21 and 22 unless otherwise mentioned. In an embodiment the surface of the grid 32 is raised with respect to the surface of the substrate table WT, WT2, as shown in FIG. 25, which corresponds to a cross-section of the substrate table WT, WT2 along the line Y-Y. The surface 60 of the substrate table WT, WT2 is lower than the surface of the grid plate 32. In the gap 43 in the grid 32 corresponding to the position of the transfer lane 38, the grid is raised with respect to the surface of the transfer lane 38, as shown in FIG. 26. FIG. 26 shows a cross-section of the substrate table WT, WT2 along the line X-X. The surface 60 of the substrate table WT, WT2 is substantially the same height as the transfer lane 38. In this arrangement a droplet escaping from the space 11 may be on the surface of the transfer lane 38 or the surface 60 of the substrate table WT, WT2. Because the surface of the grid 32 is raised the droplet may not readily contact the surface of the grid plate 32. FIG. 29 shows a perspective view of the embodiment in FIGS. 25 and 26, and shows the grid 32 is raised with respect to the surface 60 of the substrate table WT, WT2.

Figure 30:
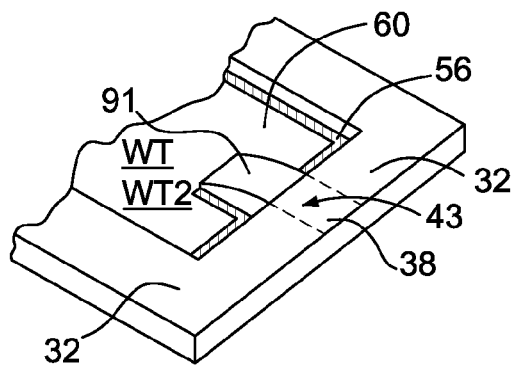
FIG. 30 schematically depicts, in perspective, a variation of the embodiment shown in FIG. 29.

FIG. 30 shows a variation similar to the arrangement in FIG. 29 but without the gap 43 in the raised grid 32 for the transfer lane 38. In FIG. 30, the transfer lane 38 passes over the grid 32 which is raised relative to the surface 60 of the substrate table WT, WT2. A smooth surface between the surface of the grid 32 and the lower surface 60 of the substrate table WT, WT2 is provided by a ramp 91. Without a step in the surface between the substrate table WT, WT2 and the grid 32, the risk of liquid loss from the immersion space 11 may be reduced, if not prevented. In an embodiment, a fluid extraction opening 56 may be located between the surface of the raised grid 32 and the surface 60 of the substrate table WT, WT2. The fluid extraction opening 56 may be located in a recess or groove between the two surfaces 32, 60. In addition to having the raised grid, the fluid extraction opening helps reduce if not prevent liquid in the form of, for example, a droplet from reaching the surface of the grid 32 from the surface 60 of the table within the grid 32. The fluid extraction opening may serve as a barrier for liquid which would otherwise flow past it.

Figure 27:
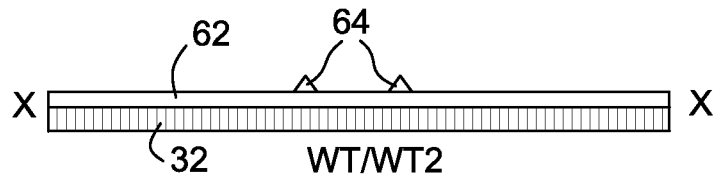
FIG. 27 depicts schematically, in cross-section, an embodiment of the substrate table shown in FIG. 20 along the line X-X.
Figure 28:
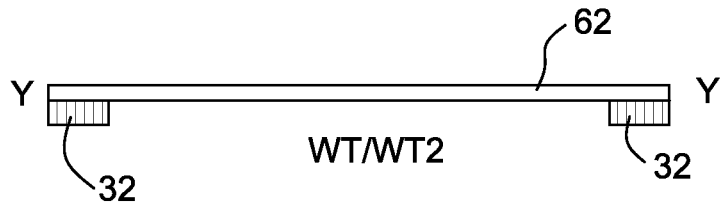
FIG. 28 depicts schematically, in cross-section, an embodiment of the substrate table shown in FIG. 20 along the line Y-Y.

FIGS. 27 and 28 refer to the same features as FIGS. 21 and 22 unless otherwise mentioned. In an embodiment, the grid 32 and the surface 60 of the substrate table WT, WT2 are covered with a covering with a protective surface, for example a transparent plate 62. The transparent plate 62 may be, for example, a fused quartz plate as described in U.S. patent application No. 61/218,712, filed on 19 Jun. 2009, which is hereby incorporated by reference in its entirety. The positioning system may operate with the measurements being made through the transparent plate. A droplet does not contact the surface of the grid 32, helping prevent the grid from becoming contaminated. If the transparent plate 62 over the grid becomes contaminated, the plate 62 may cleaned in-situ, or replaced and optionally cleaned for later re-use.

The surface of the transparent plate 62 may be substantially planar, as shown in FIG. 27 (which corresponds to a cross-section along the line Y-Y in FIG. 20) so that any part of its surface may pass under the fluid handling structure unrestrictedly. The transparent plate 62 may cover the portion 44, 46 of the substrate table WT, WT2. Optionally there is a gap 43 in the grid 32 corresponding to the location of the transfer lane 38. In an embodiment the transparent plate has a ridge 64 at an edge of the transfer lane 38. The ridge may be a protrusion from the transparent plate 62 as shown in FIG. 27 which corresponds to a cross-section between X-X in FIG. 20. The ridge 64 may help limit the movement of a droplet outside the transfer lane 38. The ridge may be part of a barrier 50 of the transfer lane 38. An encoder sensor arrangement may be used like that shown in FIG. 23 and/or FIG. 24. However, as the plate 62 is transparent to visible radiation it may be transparent to radiation used by a detector in the positioning system. As the plate 62 may be treated, for example, with a lyophobic (e.g., hydrophobic) coating to repel immersion liquid, the risk of a droplet or contaminating particle may be sufficiently low that the arrangement without a reserve encoder 75 may be used. In an embodiment the protrusion may be formed from a lyophobic, e.g. hydrophobic, coating. The protrusion 62 is substantially coplanar with the surface of the transparent plate. The coating may serve the same function as the protrusion in serving as a barrier to prevent the flow of liquid thereover.

Figure 31:
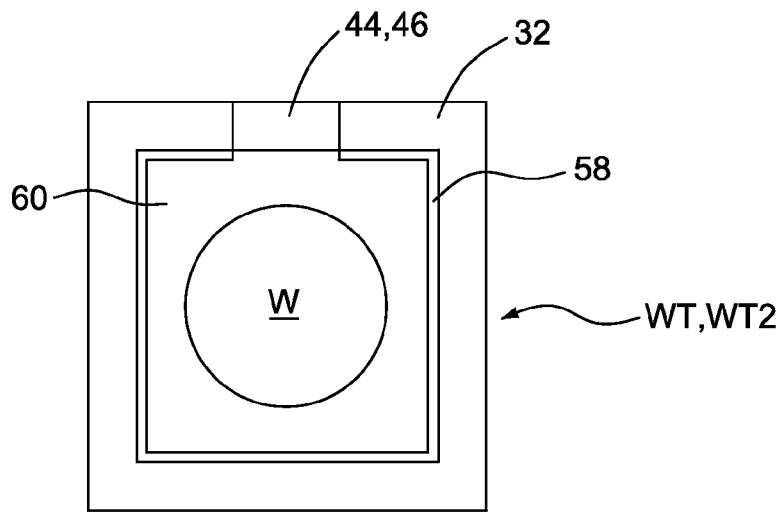
FIG. 31 schematically depicts, in plan, an embodiment of a substrate table with a barrier around an inner edge of a grid.

In an embodiment, as shown in FIG. 31 having similar features as FIG. 20, between the surrounding surface 60 of the substrate table WT, WT2 around the substrate W and the surface of the grid 32 is a barrier 58 in the form of a lyophobic surface. The lyophobic barrier 58 serves as a barrier to liquid which escapes from the space 11 from reaching the surface of the grid 32. The lyophobic barrier 58 serves substantially the same purpose as the step between the surrounding surface 60 and the surface of the grid 32 present in the embodiment shown in FIGS. 26, 29 and 30. Desirably the lyophobic surface is a two dimensional lyophobic surface having substantially the same contact angle with respect to the immersion liquid in two perpendicular directions of movement over the surface. The barrier 58 extends around the periphery of the surrounding surface 60, with a gap for passing underneath the immersion space 11 during, for example, substrate swap. The gap may correspond to the location of the transfer lane 38. The periphery of the barrier 58 may correspond to an inner edge of the grid 32.

The same benefit as achieved by lyophobic barrier 58 may be achieved by a barrier in the same location formed by at least one fluid extraction opening or a protrusion 64. In an embodiment the fluid extraction opening is present in a recess or groove in the location of the barrier 58. In an embodiment the barrier 58 comprises at one or more selected from: a step in surface height, a protrusion, a contact angle surface property such as a lyophobic surface, and/or a fluid extraction opening which may be located in a recess.

As a droplet may remain on a part of the transfer lane 38, the transfer lane may be intermittently cleaned. The cleaning action may be part of a periodic cleaning cycle, may occur upon detection of a threshold of contamination level, or both. Cleaning may be in-situ; it may be automatic. Such cleaning may be achieved in using a modified fluid handling structure 12 capable of supplying and removing immersion liquid to clean a surface underneath the fluid handling structure, such as a surface of a table, a removable bridge, a part of a transfer lane 38, and/or a part of a transparent plate 62. Cleaning of at least a part, such as a table or removable bridge, may be off-line (e.g. not part of the normal operating procedure). The part may be removed and replaced by another clean component to reduce downtime. The contaminated part may be cleaned for re-use.

Figure 32:
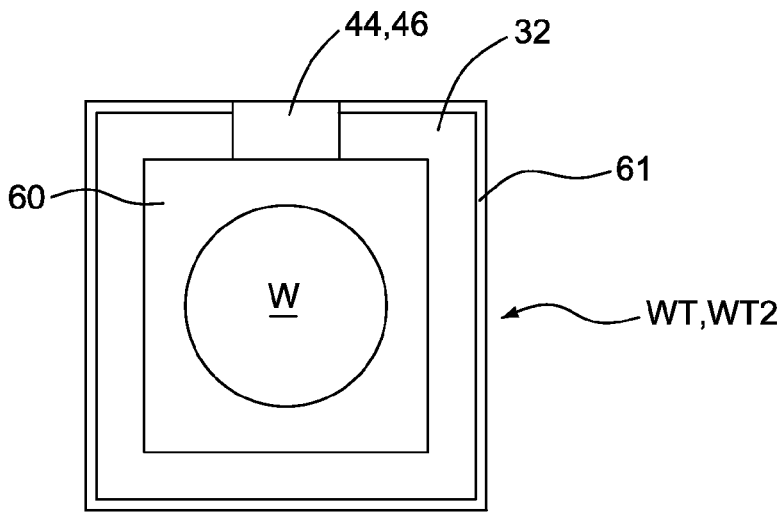
FIG. 32 schematically depicts, in plan, an embodiment of a substrate table with a barrier around an outer edge of a grid.

FIG. 32 shows an arrangement similar to FIG. 31, except the barrier is an edge barrier 61 located around the periphery, or outer edge, of the grid 32. The edge barrier 61 helps prevent liquid from flowing off the grid over the outer edge of the grid 32. Such an arrangement may be desirable, for example, when cleaning the surface of the grid using liquid, for example from a liquid confinement structure 12. Liquid loss over the outer edge is reduced, if not prevented. With the barrier 61, less precise control may be required to control the cleaning liquid relative to the edge of the grid 32. With a reduced need for accuracy, the speed of cleaning of the grid 32 may be increased, so that the cleaning time and downtime for cleaning operations may be reduced and throughput increased.

Figure 33:
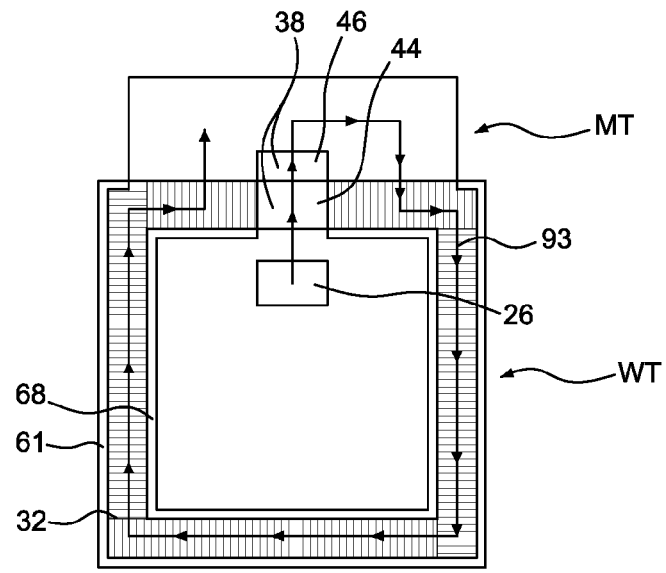
FIG. 33 schematically depicts, in plan, an embodiment of a substrate table and a measurement table indicating a cleaning path over the surfaces of both tables.

During cleaning, liquid may flow towards the surrounding surface 60. A barrier 58 associated with an inner edge of the grid 32 may be used to reduce, if not prevent, the inward flow of liquid during cleaning. Such an arrangement is shown in FIG. 33. The barrier 61 does not extend the full length of the side of the table WT which adjoins the adjoining table during substrate swap. On relative movement between the tables WT, WT2, MT and the projection system, the barrier 61 extends so far as to allow a path 93 for a liquid footprint 26 between the tables without crossing the barrier 61. The surface moving under the liquid footprint is substantially continuous, desirably with a consistent contact angle. To clean the surface of the grid 32, the transfer lane 38 may move under the liquid footprint 26, so that the second table MT, WT2 is under the liquid footprint. The tables MT, WT, WT2 then move so that the grid 32 moves under the liquid footprint 26. The movement is in a locus generally defined by the outer edge, inner edge or both edges of the grid (e.g., the path 93) until the substrate table is replaced under the liquid footprint 26 by the second table MT, WT2.

A part of the transfer lane 38 surface may comprise a replaceable component, such as a planar component which may be fixed in place, for example by adhesive. Such a replaceable component may be a sticker. A sticker may be shaped to cover a specific component, such as a removable bridge 24 and/or a portion 44, 46 of the transfer lane 38. If contamination of a sticker reaches a threshold level, the sticker may be cleaned like any other surface. The sticker may be removed and replaced with a new sticker having the same features and shape as the removed sticker. The sticker may have a specified surface property that may deteriorate through use, for example by interaction with one or more selected from: immersion liquid (such as ultra-pure water), exposure radiation and/or contaminating particles (which may derive the substrate coating). Such a surface property may be a lyophobic property, e.g. a hydrophobic property with respect to water, of a certain contact angle or preferred direction, such as a one dimensional lyophobic surface.

Figure 34:
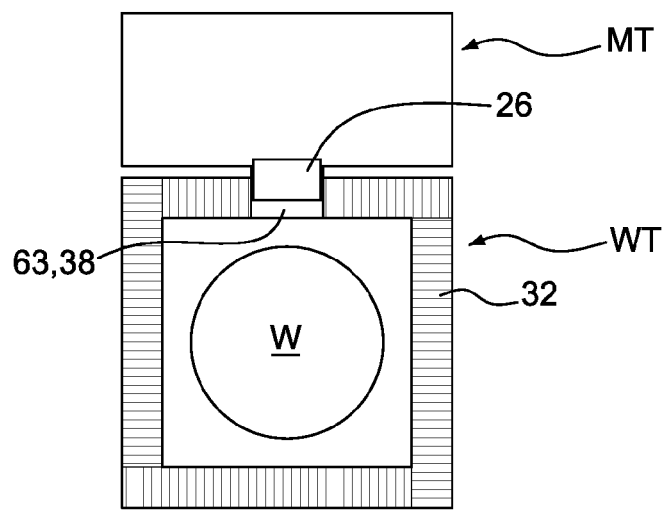
FIG. 34 schematically depicts, in plan, an embodiment of a dual table arrangement with a substrate table and a measurement table having an extended surface to bridge the gap between the two tables.
Figure 35:
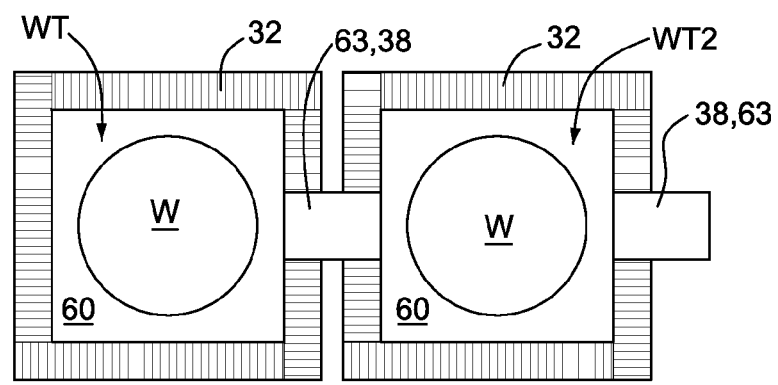
FIG. 35 schematically depicts, in plan, an embodiment of a dual table arrangement with two substrate tables, each table having an extended surface to bridge the gap between the two tables.

An embodiment of transfer lane 38 is an extended surface 63 of a table WT which extends to contact the side of the second table WT2, MT, covering or overhanging a portion of the second table WT2, MT, as shown in FIGS. 34 and 35. The extended surface may have any of the features of the transfer lane herein described, noting that the entire surface of such a transfer lane is a contiguous surface of one substrate table. FIG. 34 shows an arrangement for a substrate table WT with a measurement table MT. At least one of the tables WT, MT has an extended surface 63. Desirably the measurement table MT has the extended surface because having such a feature on the substrate table may distort the center of gravity of the table, preventing sufficiently accurate measurement and positioning of the table and therefore imaging of a substrate on the table WT.

The part of the grid 32 along the side of the table closest to the measurement table MT may have a recessed portion. The recessed portion may correspond to the location of the extended surface 63. The recessed portion may be the entire length of the grid adjoining the measurement table MT. In use, the surface of the tables that passes under the liquid footprint 26 includes the extended surface 63. The surface of the grid 32 therefore passes the footprint 26, without the grid 32 coming into contact with the footprint 26 or liquid from the immersion space 11. The risk of contamination and degradation of the grid 32 is reduced.

FIG. 35 shows an arrangement in a system with two substrate tables. Each table WT, WT2 has an extended surface on a similar side. Such an arrangement allows the positions of the two tables to alternate, for example, for each following substrate swap. The general relative movement of the footprint 26 and the tables WT, WT2, for example as depicted, between consecutive substrate swaps is from left to right; the rightmost table WT, WT2, moving to the left of the leftmost table for the following substrate swap Although the following FIGS. 36 to 39 show arrangements which use a measurement table, the described arrangements may be modified for use with two substrate tables WT, WT2, each having an extended surface 63.

Figure 36:
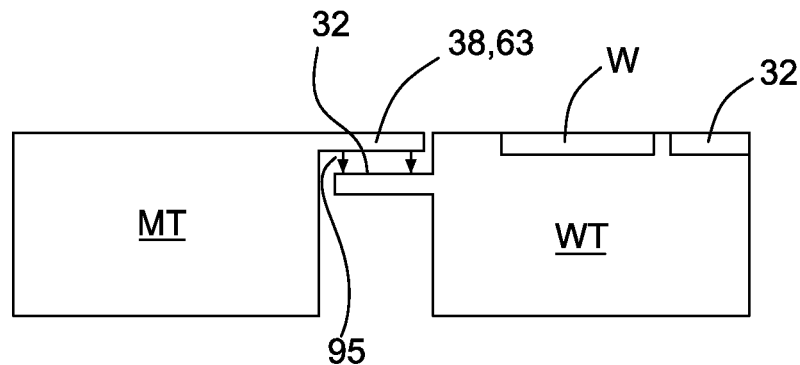
FIG. 36 schematically depicts, in cross-section, an embodiment of a dual table arrangement with a substrate table and a measurement table as shown in FIG. 34.

FIG. 36 is a cross-section of an embodiment of the arrangement of FIG. 34. The extended surface 63 is supported by non-contact support, such as a gas bearing. The gas bearing may form between the undersurface of the extended surface 63 and the facing surface of the substrate table WT, which may be a portion of the grid 32. The gas flow 95 for the gas bearing may be supplied by one or more outlets located in the undersurface of the extended surface 63 and/or in the facing surface of the substrate table WT. The gas flow is directed in use towards the other of the undersurface of the extended surface 63 and/or the upper surface of the facing surface of the substrate table WT. The extended surface 63 may be made of thin plate which may be resilient under operating forces of an immersion system The use of the gas bearing with the extended surface 63 may improve the stiffness of the extended surface 63 without contact between the measurement and substrate tables MT, WT. Contact between the tables could increase the risk of damage to one or more tables and increase the risk of interference to the measurement and positioning systems of the tables.

Figure 37:
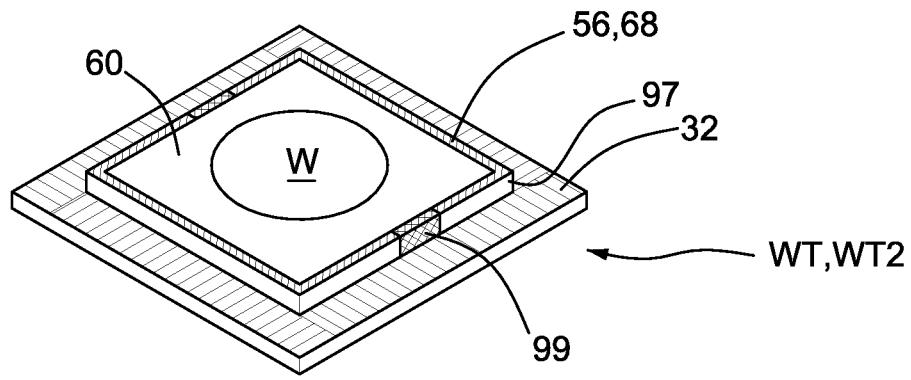
FIG. 37 schematically depicts, in perspective, an embodiment of a substrate table.

FIG. 37 shows an embodiment where a barrier 68 is formed at a downward step 97 between the surrounding surface 60 and the grid 32. The grid 32 is lower than the surrounding surface 60, in an embodiment around the periphery of the substrate table WT, WT2. In an embodiment with the same features, the grid 32 may be located elsewhere, for example on the undersurface of the table. The surface around the periphery of the downward step 97 may collect immersion liquid which flows onto the surface. Such liquid may flow off the extended surface. The liquid may be a droplet which flows down the downward step 97. It may have escaped from the immersion liquid in the space 11 during relative motion between the substrate table WT, WT2 and the liquid confinement structure 12. There may be one or more openings in the surface around all or a part of the periphery of the downward step 97 to collect, remove or extract liquid from the surface.

Figure 38:
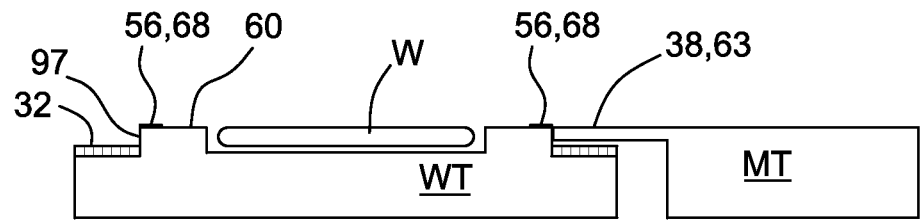
FIG. 38 schematically depicts, in cross-section, an embodiment of a dual table arrangement with a substrate table of FIG. 37 and a measurement table.
Figure 39:
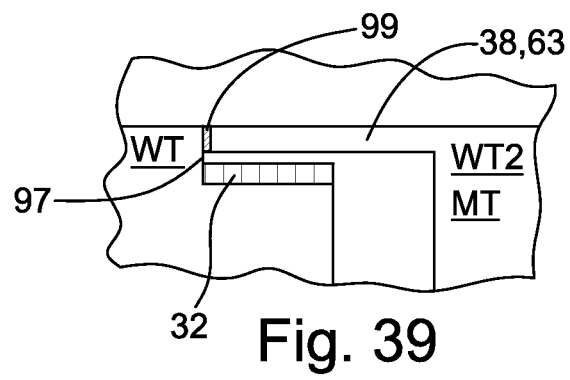
FIG. 39 schematically depicts, in cross-section, detail of part of the dual table arrangement shown in FIG. 38.

FIG. 38 shows a cross-section of the substrate table of FIG. 37 with a measurement table MT. In an embodiment, to help prevent liquid reaching the grid 32, the barrier 68 includes a lyophobic surface, a protrusion, and/or at least one fluid extraction opening between the surrounding surface 60 and the inner edge of the grid 32. In an embodiment, instead of a gas bearing to help support the extended surface 63, the substrate table has an engagement device 99 such as notch in the substrate table WT, WT2. During substrate swap a surface of the extended surface 63 may contact, desirably engage or rest on, the notch 99 as shown in FIG. 39. Such an arrangement avoids the use of gas flows which can have thermally undesirable effects.

In an aspect, there is provided an immersion lithographic apparatus comprising: a substrate table configured to support a substrate; a fluid handling structure configured to supply and confine immersion liquid to a space defined between a projection system and the substrate table, the substrate, or both; a swap table configured to be located under the fluid handling structure to retain liquid in the space; and a transfer surface configured to be located under the fluid handling structure and between a surface of the substrate table and a surface of the swap table, wherein the transfer surface is configured to prevent immersion liquid moving over at least part of the transfer surface in a direction with a component perpendicular to a direction of relative motion between the fluid handling structure and the transfer surface.

In an embodiment, the transfer surface is configured to bridge the surface of the substrate table and the surface of the swap table, the surfaces of the substrate table and swap table moveable beneath the fluid handling structure. In an embodiment, between the surfaces of the substrate table and the swap table is a positioning surface, a positioning system comprising the positioning surface. In an embodiment, the positioning surface is an encoder grid. In an embodiment, the substrate table comprises a transparent plate above the positioning surface, desirably planar with the transfer surface. In an embodiment, the positioning surface is adjacent the transfer surface. In an embodiment, the positioning surface is raised above the transfer surface. In an embodiment, a protective surface corresponds to the position of the positioning surface relative to the transfer surface and the protective surface is above the positioning surface. In an embodiment, the positioning system comprises a plurality of sensors including a sensor to compensate for the transfer surface crossing the positioning surface. In an embodiment, at least part of the surface of the transfer surface is at least part of a surface of the swap table, the substrate table, or both. In an embodiment, facing edges of the swap table and the substrate table are spaced apart so that between the edges is a gap. In an embodiment, at least part of the transfer surface is part of a removable bridge configured to be locatable between the swap table and the substrate table. In an embodiment, the swap table is: a measurement table configured not to support a substrate, or a substrate table configured to support a substrate. In an embodiment, the transfer surface is dimensioned to at least exceed the dimension of a liquid footprint of the fluid handling structure in a plane parallel to the surface of the transfer surface and perpendicular to the direction of relative motion between the fluid handling structure and the transfer surface. In an embodiment, the transfer surface is configured to thermally isolate its surface from the substrate table and desirably the swap table. In an embodiment, the transfer surface comprises a heat pipe configured to be operable to compensate a thermal load applied to the transfer surface. In an embodiment, the surface of the transfer surface is lyophobic. In an embodiment, at least part of the transfer surface is provided by a coating. In an embodiment, the transfer surface comprises an elongate barrier configured to bar motion of immersion liquid in the direction with a component perpendicular to the direction of relative motion between the fluid handling structure and the transfer surface, the barrier being generally aligned in a direction parallel to the direction of relative motion. In an embodiment, the elongate barrier comprises a surface having increased contact angle relative to an adjacent surface. In an embodiment, the elongate barrier comprises a ridge. In an embodiment, the elongate barrier comprises an elongate channel and an opening in the channel configure to remove fluid from the channel as the transfer surface moves under the fluid handling structure. In an embodiment, the elongate barrier is associated with a sharp edge. In an embodiment, the sharp edge is associated with a side of the transfer surface substantially parallel to the direction of relative motion. In an embodiment, the transfer surface comprises at least a replaceable sticker configured to provide the transfer surface. In an embodiment, the apparatus further comprises the projection system, the projection system configured to direct a patterned beam of radiation towards a target portion of a substrate. In an embodiment, the swap table is configured to be located under the fluid handling structure during swap of the substrate on the substrate table to retain liquid in the space.

According to an aspect, there is provided a shutter member for an immersion lithographic apparatus, the shutter member having at least part of a transfer surface configured to prevent immersion liquid in a confined space moving over at least part of the transfer surface in a direction with a component perpendicular to a direction of relative motion between the confined space and the shutter member. In an embodiment, the liquid in the confined space is confined in the space by a fluid handling structure. In an embodiment, the fluid handling structure is configured to supply and confine immersion liquid in a space between a projection system and a facing surface, the facing surface being the surface of a substrate table configured to support a substrate, a substrate supported by the substrate table, or a surface of the shutter member. In an embodiment, the shutter member is configured to move under the confined space during substrate swap.

According to an aspect, there is provided a device manufacturing method, the method comprising: confining immersion liquid in a space in contact with a surface of a substrate table; replacing the surface of the substrate table with a shutter surface by moving the substrate table and the shutter surface in one motion so that the substrate table moves away from under the fluid handling structure and the shutter surface replaces the surface of the substrate table under the fluid handling structure, wherein in replacing the substrate table with the shutter surface, moving a transfer surface under the fluid handling structure, the transfer surface preventing immersion liquid moving over at least part of the transfer surface in a direction with a component perpendicular to a direction of motion of the transfer surface. In an embodiment, immersion liquid is supplied to the space and the liquid in the space is contact with a localized area of the substrate table. In an embodiment, the shutter member comprises a surface of another table.

According to an aspect, there is provided a method of operating an immersion lithographic apparatus, the method comprising: supporting a substrate on a substrate table; supplying and confining immersion liquid to a space defined by a fluid handling structure between a projection system and the substrate table, the substrate, or both; replacing a surface of the substrate table under the fluid handling structure with a shutter surface, the shutter surface including a surface of a swap table; moving a transfer surface under the fluid handling structure as the surface of the swap table replaces the surface of the substrate table; and during moving the transfer surface, preventing immersion liquid moving over at least part of the transfer surface in a direction with a component perpendicular to a direction of relative motion between the fluid handling structure and the transfer surface.

According to an aspect, there is provided an immersion lithographic apparatus comprising: a substrate table configured to support a substrate; a fluid handling structure configured to supply and confine immersion liquid to a space defined between a projection system and the substrate table, the substrate, or both; a shutter member configured to be located under the fluid handling structure during swap of the substrate on the substrate table, the shutter member being a swap table, wherein a transfer surface is arranged to be between surfaces of the substrate table and the swap table, the transfer surface configured to be moved under the fluid handling structure and configured to prevent immersion liquid moving over at least part of the transfer surface in a direction with a component perpendicular to a direction of relative motion between the fluid handling structure and the transfer surface. In an embodiment, the transfer surface comprises a part of the surface of the substrate table, a part of the surface of the swap table, or both. In an embodiment, the apparatus further comprises a bridge locatable between the substrate table and the swap table during substrate swap, wherein the transfer surface comprises a top surface of the bridge.

According to an aspect, there is provided an immersion lithographic apparatus, comprising: a substrate table configured to support a substrate; a fluid handling structure configured to supply and confine immersion liquid to a space defined between a projection system and the substrate table, the substrate, or both; and a transfer surface configured to be located under the fluid handling structure and between a surface of the substrate table and a shutter surface, the shutter surface configured to replace the surface of the substrate table under the fluid handling structure and the transfer surface configured to prevent immersion liquid moving over at least part of the transfer surface in a direction with a component perpendicular to a direction of relative motion between the fluid handling structure and the transfer surface.

Although specific reference may be made in this text to the use of lithographic apparatus in the manufacture of ICs for example an IC device, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc, such as a device comprising one of these applications. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a substrate table configured to support a substrate;
   a fluid handling structure configured to supply and confine immersion liquid to a space defined between a projection system and the substrate table, the substrate, or both;
   a swap table configured to be located under the fluid handling structure to retain liquid in the space; and
   a transfer surface configured to be located under the fluid handling structure and between a surface of the substrate table and a surface of the swap table, wherein the transfer surface is configured to prevent immersion liquid moving over at least part of the transfer surface in a horizontal direction with a component perpendicular to a direction of relative motion between the fluid handling structure and the transfer surface.

2. The immersion lithographic apparatus of claim 1, wherein the transfer surface is configured to bridge the surface of the substrate table and the surface of the swap table, the surfaces of the substrate table and swap table moveable beneath the fluid handling structure.

3. The immersion lithographic apparatus of claim 1, wherein between the surfaces of the substrate table and the swap table is a positioning surface, a positioning system comprising the positioning surface.

4. The immersion lithographic apparatus of claim 3, wherein the positioning surface is an encoder grid.

5. The immersion lithographic apparatus of claim 3, wherein the substrate table comprises a transparent plate above the positioning surface.

6. The immersion lithographic apparatus of claim 3, wherein the positioning surface is adjacent the transfer surface.

7. The immersion lithographic apparatus of claim 3, wherein a protective surface corresponds to the position of the positioning surface relative to the transfer surface and the protective surface is above the positioning surface.

8. The immersion lithographic apparatus of claim 1, wherein at least part of the surface of the transfer surface is at least part of a surface of the swap table, the substrate table, or both.

9. The immersion lithographic apparatus of claim 1, wherein the transfer surface is dimensioned to at least exceed the dimension of a liquid footprint of the fluid handling structure in a plane parallel to the surface of the transfer surface and perpendicular to the direction of relative motion between the fluid handling structure and the transfer surface.

10. The immersion lithographic apparatus of claim 1, wherein the transfer surface is configured to thermally isolate its surface from the substrate table.

11. The immersion lithographic apparatus of claim 1, wherein the surface of the transfer surface is lyophobic.

12. The immersion lithographic apparatus of claim 1, wherein the transfer surface comprises an elongate barrier configured to bar motion of immersion liquid in the horizontal direction with the component perpendicular to the direction of relative motion between the fluid handling structure and the transfer surface, the barrier being generally aligned in a direction parallel to the direction of relative motion.

13. The immersion lithographic apparatus of claim 12, wherein the elongate barrier comprises an elongate channel and an opening in the channel configure to remove fluid from the channel as the transfer surface moves under the fluid handling structure.

14. A shutter member for an immersion lithographic apparatus, the shutter member having at least part of a transfer surface configured to prevent immersion liquid in a confined space moving over at least part of the transfer surface in a horizontal direction with a component perpendicular to a direction of relative motion between the confined space and the shutter member.

15. A device manufacturing method, the method comprising:
confining immersion liquid in a space in contact with a surface of a substrate table;
replacing the surface of the substrate table with a shutter surface by moving the substrate table and the shutter surface in one motion so that the substrate table moves away from under the fluid handling structure and the shutter surface replaces the surface of the substrate table under the fluid handling structure,
wherein in replacing the substrate table with the shutter surface, moving a transfer surface under the fluid handling structure, the transfer surface preventing immersion liquid moving over at least part of the transfer surface in a horizontal direction with a component perpendicular to a direction of motion of the transfer surface.

16. A method of operating an immersion lithographic apparatus, the method comprising:
supporting a substrate on a substrate table;
supplying and confining immersion liquid to a space defined by a fluid handling structure between a projection system and the substrate table, the substrate, or both;
replacing a surface of the substrate table under the fluid handling structure with a shutter surface, the shutter surface including a surface of a swap table;
moving a transfer surface under the fluid handling structure as the surface of the swap table replaces the surface of the substrate table; and
during moving the transfer surface, the transfer surface preventing immersion liquid moving over at least part of the transfer surface in a horizontal direction with a component perpendicular to a direction of relative motion between the fluid handling structure and the transfer surface.

17. An immersion lithographic apparatus comprising:
a substrate table configured to support a substrate;
a fluid handling structure configured to supply and confine immersion liquid to a space defined between a projection system and the substrate table, the substrate, or both;
a shutter member configured to be located under the fluid handling structure during swap of the substrate on the substrate table, the shutter member being a swap table,
wherein a transfer surface is arranged to be between surfaces of the substrate table and the swap table, the transfer surface configured to be moved under the fluid handling structure and configured to prevent immersion liquid moving over at least part of the transfer surface in a horizontal direction with a component perpendicular to a direction of relative motion between the fluid handling structure and the transfer surface.

18. An immersion lithographic apparatus, comprising:
a substrate table configured to support a substrate;
a fluid handling structure configured to supply and confine immersion liquid to a space defined between a projection system and the substrate table, the substrate, or both; and
a transfer surface configured to be located under the fluid handling structure and between a surface of the substrate table and a shutter surface, the shutter surface configured to replace the surface of the substrate table under the fluid handling structure and the transfer surface configured to prevent immersion liquid moving over at least part of the transfer surface in a horizontal direction with a component perpendicular to a direction of relative motion between the fluid handling structure and the transfer surface.

19. The immersion lithographic apparatus of claim 12, wherein the elongate barrier comprises a surface having increased contact angle relative to an adjacent surface.

20. The immersion lithographic apparatus of claim 12, wherein the elongate barrier comprises a ridge.

* * * * *